United States Patent
Kulkarni et al.

[11] Patent Number: 5,991,699
[45] Date of Patent: Nov. 23, 1999

[54] DETECTING GROUPS OF DEFECTS IN SEMICONDUCTOR FEATURE SPACE

[75] Inventors: Ashok V. Kulkarni, San Jose; Paul Rockwell, Santa Cruz, both of Calif.

[73] Assignee: KLA Instruments Corporation, San Jose, Calif.

[21] Appl. No.: 08/886,805

[22] Filed: Apr. 2, 1997

Related U.S. Application Data

[63] Continuation of application No. 08/434,676, May 4, 1995, abandoned.

[51] Int. Cl.$^6$ .................................................. H01L 21/66
[52] U.S. Cl. .............................. 702/83; 702/35; 702/81; 702/82; 702/84; 364/468.16; 364/468.17; 364/468.28; 438/10; 438/12; 438/18
[58] Field of Search ..................... 364/468.01–468.03, 364/468.16, 468.17, 468.28, 488–490; 702/34, 35, 81–84, 179, 182; 382/147, 149, 151; 250/559.45; 324/158.1, 765, 764; 438/16, 17, 10, 12, 18; 706/904, 912, 906, 914, 921

[56] References Cited

U.S. PATENT DOCUMENTS

| | | | |
|---|---|---|---|
| 5,103,557 | 4/1992 | Leedy | 438/12 |
| 5,210,041 | 5/1993 | Kobayashi et al. | 437/8 |
| 5,219,765 | 6/1993 | Yoshida et al. | 438/10 |
| 5,240,866 | 8/1993 | Friedman et al. | 437/8 |
| 5,286,656 | 2/1994 | Keown et al. | 438/18 |
| 5,360,747 | 11/1994 | Larson et al. | 437/8 |
| 5,440,649 | 8/1995 | Kiyasu et al. | 382/147 |
| 5,475,766 | 12/1995 | Tsuchiya et al. | 382/144 |
| 5,544,256 | 8/1996 | Brecher et al. | 382/149 |
| 5,598,341 | 1/1997 | Ling et al. | 364/468.17 |
| 5,665,609 | 9/1997 | Mori | 438/16 |

*Primary Examiner*—Hal Wachsman
*Attorney, Agent, or Firm*—Allston L. Jones

[57] ABSTRACT

Techniques for improving manufacturing process control based on inspection of manufactured items at intermediate process steps, based on clustering and binning of defect data. Additionally, the using the defect data produced by inspection machines to improve manufacturing process control specifically relating to semiconductor manufacturing process control. Examples described here relate specifically to semiconductor wafers, but may be generalized to any manufacturing process.

42 Claims, 12 Drawing Sheets

Mapping Array Elements to a Physical Grid

Geometry of Probability Calculation for $C_s$ Equal 2, 3, 4, and 5.

Probability Curves for Cluster Size (Cs) Equal to Two and Three

DETECTING GROUPS OF DEFECTS IN SEMICONDUCTOR FEATURE SPACE

This is a continuation of application of Ser. No. 08/434,676 filed on May 4, 1995, abandoned.

FIELD OF THE INVENTION

Analysis of defects detected during production of semiconductor wafers to identify causation and system control to reverse occurrence of similar defects in later produced wafers. More specifically, the identification of a groups of defects which have similar features or is which have the same probable cause.

BACKGROUND OF THE INVENTION

The key to profitability in the semiconductor industry is yield management. Virtually any integrated circuit manufacturer would be profitable if they could have a manufacturing process that had a 100% yield, and certainly would be unprofitable if the yield were below 20%. To obtain a high yield rate is an on-going task of manufacturers that requires continuous monitoring and identifying production problems that are adversely impacting yield.

Typically, a semiconductor wafer may have a very large number of defects (e.g., more than 1000) which may have resulted from a great number of causations. Because, in general, the number of defects is very high, it is extremely time-consuming and expensive for an operator to examine each and every defect, and for that reason such a thorough examination of a wafer is infrequently performed.

In general there are two broad categories that cause yield reduction in the manufacturing process: handling problems; and process problems. Grouped defects typically have a common causation, some of the well known causations are chemical smears, grain, haze, microscoring, wand marks, brush marks, rail marks, impact marks, hot spots, shower patterns, exposure shutter patterns, doughnut patterns, poorly or unevenly developed layers on the die, over etching, under etching, thermal variations, etc.

Defects, no matter what the cause, have their own signatures which can be used to identify the causal mechanism of that particular defect, or defect group or pattern. Thus, it has also been determined that defects having the same causal relationship are likely to be statistically similar in their properties, such as location, proximity on the wafer, size and shape, as well as the shape of the defect pattern or cluster of defects resulting from the same causal mechanism.

Typically, an assessment of the state of a manufacturing process involves:

1. Selection of the set of manufactured articles to inspect;
2. Inspection of the selected article(s);
3. Selection of defects to review—all defects detected, or a selected sample;
4. Review of selected defects;
5. Analysis of inspection and review results; and
6. Determination of process control action to be taken. (This may include a decision of which articles to inspect next.)

In semiconductor manufacturing, integrated circuit inspection is typically performed between selected process steps. These inspections also are performed automatically with a machine designed specifically for this task with those machines typically performing either optical inspections or electrical tests. The meaning of inspection in this instance is the detection of observed differences between the expected product and the actual product either in appearance or electrical performance. The principle output of an inspection machine is typically the number of detected defects, a list of defect locations, and some measured properties of each defect.

Defects detected are often much larger than the detection system resolution used by the inspection system, but are usually reported in terms of the detection system resolution. A single defect event may cover an area many orders of magnitude larger than the inspection system resolution. As a result, a single defect event may be detected as multiple defects (e.g., a scratch may have several line segments that make up the total scratch). Thus, if the defect events are misidentified or miscounted there will be a distortion of the assessment of the state of the process that resulted in the defects, leading to incorrect process control decisions to correct the source of the defects.

After detection, defects are often reviewed manually with defect review being a process of assigning defect classification types to detected defects. Review strategies may vary, but in general that review proceeds as follows:

1. Defects to be reviewed are selected (This may be all of the defects detected during inspection, or a manually or automatically selected sample);
2. The operator views the defect, or an image of the defect using a microscope, scanning electron microscope (SEM), etc.; and
3. The operator assigns a defect type classification, typically a numerical code, to the defect based on preselected criteria.

Since it is generally believed that a high degree of spatial correlation among a group of defects usually indicates a common defect causality, manual clustering is occasionally used during review:

1. The operator manually searches for clusters in the set of defect data (i.e., on a map showing all defects on a particular wafer—a wafer map);
2. The operator manually selects some defects from each cluster; and
3. Based on the types of defects identified in the cluster, a type classification is assigned to the cluster, and to all defects in the cluster.

Inspection and review data are typically analyzed in a number of ways. For example, correlation studies of final manufacturing yield versus each defect type are performed in order to prioritize the importance of defect types. Based significantly on this analysis, it may be determined that some defect types do not detract from yield. In other words, if one is using defect count as a Statistical Process Control (SPC) parameter, these defect types should not be included in the defect count.

Correlation studies of defect locations on a given wafer inspected at one step in the manufacturing process may be performed against the inspection results for the same wafer at a different process step, in order to determine the process step that is the source of particular defects or defect types. Identification of the processing step that is the source of a defect is a necessary condition for eliminating that source of the defects. Correlation studies of defects on one die may also be compared against other dies to identify repeating defects.

There are a number of problems with the prior art approach outlined above. Some of those problems are:

1. The number of defects detected during inspection that do not significantly affect yield can overwhelm the review process.

2. Reviewing all the defects detected is too expensive, both in the amount of time and in the amount of human labor required. This leads one to review a sample of the detected defects. Manual selection of samples is highly subjective (i.e., not random.)
3. A large delay while manually reviewing defects in a manufacturing process is undesirable, having one or all of the following negative effects:
   a. A smaller number of items will be inspected (because there is insufficient review capacity), giving a less accurate assessment of the state of the process, or
   b. A smaller percentage of defects detected will be reviewed, giving an assessment of the process state that may be skewed by bias in the manual sample selection, or
   c. The manufacturing process must be slowed down—which is generally unacceptable.
4. Some causal mechanisms produce a single defect event that is wrongly detected as a group of defect events having a common causal mechanism by an inspection machine. SPC that uses this defect count as an input is adversely affected.
5. Each defect cluster is assumed to be caused by a single causality. However, an accurate estimate of the number of defects in a cluster, and by implication the total number of clustered defects, is impractical to obtain manually. Without this correction to the defect count, SPC decisions will be based on an incorrect defect count. For example, in semiconductor processing, a radical increase in the number of detected defects on a small number of chips on a single wafer is not significant for SPC purposes, because such excursions do not significantly affect yield.
6. The inspection tool makes numerous measurements of defect properties, the results of which are not generally available during manual defect review. Manual cluster classification accuracy is therefore less than optimal.
7. The results of repeating defect detection may be skewed by the presence of clusters.
8. The results of defect source analysis may be skewed by defect events that cover more than one inspected article.
9. The review process does not take into account information previously acquired during inspection. Review typically continues until a specific number of defects, or the entire set of defects, have been reviewed.

It would prove very beneficial if group defects could be placed into certain meaningful cluster approximations of those groups with each cluster having a related causality which would make defect data much more manageable. Then it would be even more beneficial if that more manageable cluster defect data could be processed automatically to identify corrective actions necessary to reduce the number of defect groups, and therefore total number of defects, that occur in later production runs. The present invention provide such a system.

SUMMARY OF THE INVENTION

The present invention provides a system and method to identify defect groups that have a common causality during the production of semiconductor wafers and similar products. This is performed by placing selected defect data into certain meaningful clusters to approximate the actual defect groups through the use of spatial and feature data that is obtained during the inspection of the wafer at different steps in the production of that wafer. In so doing it is also more likely that the causation of the defect cluster could be determined thus enabling the identification of the corrective actions that are necessary to reduce or eliminate the occurrence of further defects from that identified causation. It might even be possible to automate the corrective actions that are determined to be necessary, thus dramatically increasing the yield of a particular type of wafer that will result in reduced production costs and long term reliability of the individual components produced from the die on that wafer.

DETAILED DESCRIPTION OF THE PREFERRED EMBODIMENT

Figure 1:
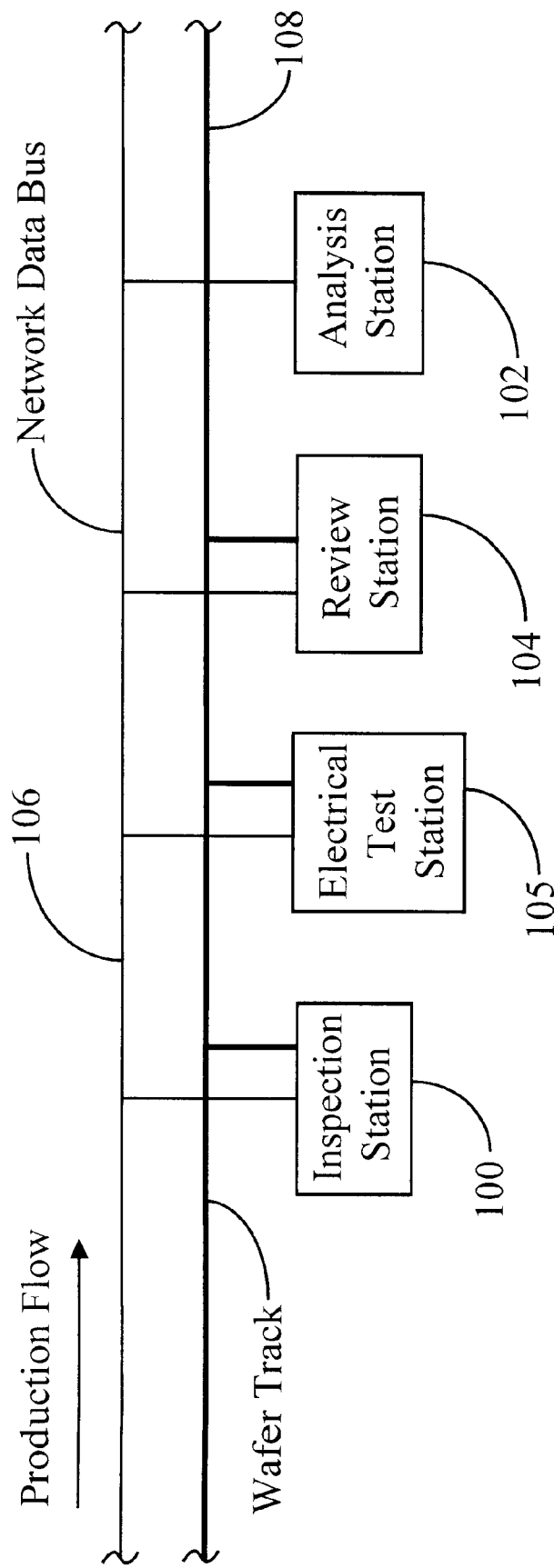
FIG. 1 is a block diagram that illustrates the incorporation of an analysis station of the present invention into the individual inspection and review station installation typically situated between wafer fabrication operation steps.

Before going directly into a detailed discussion of the present invention, more background information is offered here to better understand the present invention. FIG. 1 is a simplified block diagram that illustrates a typical prior art inspection and review station typically located between wafer fabrication operation steps and after final processing of a wafer before it is diced. These prior art stations include an inspection station 100 and a review station 104 with production flow being from left to right, as illustrated here. Included are a wafer track 108 on which the wafers are physically transported through the fabrication and inspection areas and a network data bus 106 for transporting data through the fabrication area as well. As shown here, inspection station 100 and review station 104 are interconnected with both wafer track 108 and network data bus 106 since each of those units physically examines the wafers to determine the data that is to be added to network data bus 106. In a final inspection station, electrical test station 105 is typically included to electrically exercise the individual dies before the wafer is diced.

Analysis station 102 of the present invention has been added at this point interfacing only with network data bus 106 to analyze the data therefrom. Additionally, network data bus 106 interconnects each of those components to similar stations and production equipment throughout the wafer fabrication area with wafer track 108 transporting the wafers to the various stations and production areas throughout the wafer fabrication area.

Figure 11:
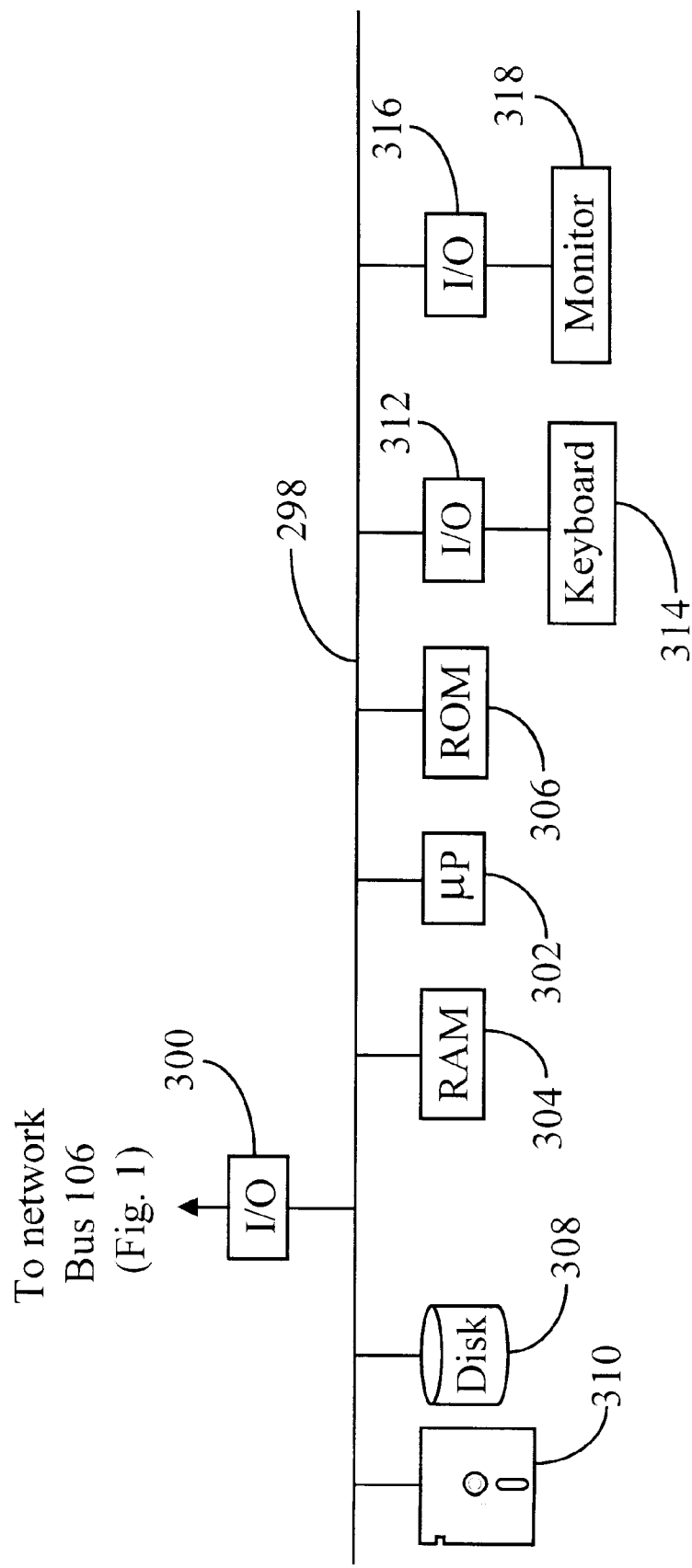
FIG. 11 is a representative circuit implementation of the analysis station of the present invention.

Inspection station 100 could be a wafer defect inspection system such as a KLA Model 2131 from KLA Instruments Corporation, San Jose, Calif., or is similar to the systems described in U.S. Pat. No. 4,618,938. Similarly, review station 104 can be implemented with a KLA Model 2608, electrical test station 105 could be LTX Micro-Master Delta 50–100 and the analysis according to the technique of the present invention can be performed by an appropriately programmed mini-computer (e.g., 486) as shown in FIG. 11 which is discussed below.

This combination of elements is of course only one of many possible implementations of such a system. Many variations are possible including ones where inspection station 100 can represent multiple types of inspection machines. It is also possible that functions of inspection station 100 and review station 104 could be included in the same piece of equipment, and it also would not be unusual in the future to see the function of analysis station 102 also included in such a piece of equipment. Another possible implementation variation might be one where analysis station 102 interfaces with multiple inspection stations 100 at different locations throughout the fabrication area, or even possibly a single analysis station 102 might be used to process defect data from several fabrication areas. It is also not out of the question that analysis station 102 might be used off-line to compare multiple production runs to determine the advantages and disadvantages to various changes that may have been made in a fabrication cycle to either improve the yield, reduce fabrication time or steps, or change the process or sequence of steps. However, for purposes of discussion here, the configuration of FIG. 1 will be referred to in the following discussions.

In the prior art, a semiconductor wafer is inspected at an inspection station 100 after each critical fabrication process step, such as an etch. The inspection process is typically completely automatic and consists of machine vision techniques that typically compare two supposedly identical patterns with each other Any discrepancy is flagged as a defect with the defect characteristics being transmitted via network data bus 106 to review station 104. The wafer next travels to review station 104, where the defects identified by inspection station 100 may be reviewed automatically or manually. At the conclusion of that review, the wafer would be returned to wafer track 108 for further processing at the next fabrication production location depending on the outcome of the analysis conducted by analysis station 102.

More specifically, inspection station 100 typically compares two supposedly identical patterns on a pixel-by-pixel basis. If there are adjacent defective pixels, each individual defective pixel is not considered as a separate defect, but these defective pixels are merged by inspection station 100 to constitute a larger defect.

As stated above and referring again to FIG. 1, after the wafer is removed from inspection station 100 it travels via wafer track 108 to review station 104. Review station 104 typically consists of an automatic stage, a computer and a microscope that allows an operator to examine the wafer. Here the defects are classified either manually or automatically under the control of the review station computer.

At the conclusion of the inspection process at inspection station 100 and review station 104 in this phase of the fabrication of the wafer, the wafer is returned to wafer track 108 and the defect data are transferred via network data bus 106 to analysis station 102. The data delivered to analysis station 102 thus includes the defect data, now consisting of a list of defects, their sizes, classifications, locations and additional parameters, such as batch, etc., where the data is retained and analyzed in analysis station 102 for statistical process control purposes.

Figure 2:
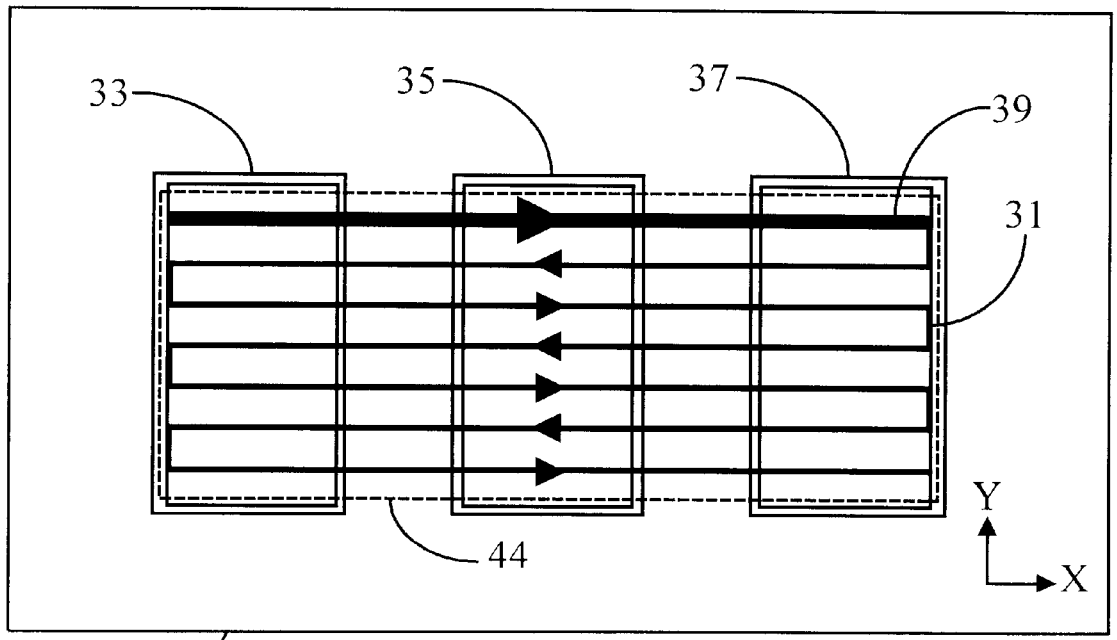
FIG. 2 illustrates a serpentine inspection path between several dies on a wafer that is used by many inspection machines currently available.

In one design of a typical inspection station 100, inspection is performed by traversing the wafer in a serpentine manner, as shown in FIG. 2, scanning the image in swaths and detecting the defects in an order that is the result of the scanning process used. As a result, the defects are placed in memory by inspection station 100, and presented to analysis station 102, in the order that the serpentine path covers the wafer. As previously stated, the typical inspection station 100 detects defects by comparing one die, on a pixel-to-pixel basis, with an adjacent die, or, in cases where a pattern repeats within a single die, one pattern is compared with an adjacent pattern. Other types of inspection machines could also be used at inspection station 100, e.g., light scattering machines. The point of concern with any of the machines that may be used is that the data presented by the machine at the various inspection stations 100 will present the defect data in a particular format and sequence. Given that format and sequence, both the format and sequence may need to be converted to that which is usable by the present invention.

Specifically, as shown in FIG. 2, die 33 is compared to die 35, and subsequently die 35 is compared to die 37. If there is a discrepancy at any one pixel location, the subsequent comparison of the same pixel locations between dies 35 and 37 resolves whether die 33 or 35 is defective. The ambiguity of which die is defective at this pixel location is then resolved by assuming that the two identical samples are flawless and the sample in the minority is defective.

Thus the data presented by inspection station 100 typically is a list of defects developed in the chronological order of detection along the serpentine scanning path (or whatever path sequence is used by the inspection machine) with each data element in such list including the x- and y-coordinates and the size of each defect. Thus, two defects in proximity to each other on this list may be located at significant chronological distances from each other on the wafer, and conversely, two defects in close proximity to each other on the wafer may be located at a significant distance from each other in the defect list presented by inspection station 100. Consequently it is difficult to detect defect clusters simultaneously with the scanning operation.

The present invention uses defect properties, or features, measured during inspection and review, or established by conversion from the original data structure created during inspection, as inputs to make various decisions. An extensive list of those specific defect properties of semiconductor wafers typically measured by an inspection station 100 is provided in TABLE I. This list will vary with the specific inspection and review machines used and the specific process control application.

TABLE I

EXAMPLES OF DEFECT PROPERTIES
MEASURABLE DURING INSPECTION

| Property | Method Used to Measure Property |
| --- | --- |
| Location | X and Y coordinates on wafer. |
| Size | Pixel count and energy amplitude. |
| Intensity | Measure of absolute brightness of the defect. |

TABLE I-continued

EXAMPLES OF DEFECT PROPERTIES MEASURABLE DURING INSPECTION

| Property | Method Used to Measure Property |
| --- | --- |
| Polarity | Brightness or darkness of the pixel relative to a reference intensity level. |
| Time | Time and date that the previous step was performed on the substrate. |
| Shape | Morphological operators (shrink, grow), circularity measure. |
| Texture | Intensity; distribution of intensity (from intensity histogram), repeating geometry, transparency. |
| Edge roughness | Variation of slope around perimeter. |
| Compactness | Variation in intensity around defect due to presence of defect. |
| Context | Open field or edges covered by using edge detection methods (gradient/zero crossings.) |

The present invention could also use data such as time of day, temperature, operator name, electrical test bit maps, etc., not just features on the surface of the wafer, as a defect feature that may help in determining the cause of the defect.

General Discussion of the Present Invention Technique

Referring again to FIG. 1, in analysis station 102 the analysis is ordinarily performed on a batch, or production run, of wafers at the points of inspection in the fabrication of the wafers. In the performance of the analysis function of the present invention with the data being provided to analysis station 102 is that which was developed at inspection stations 100 and review stations 104, therefore analysis station 102 must perform a variety of functions.

Figure 3:
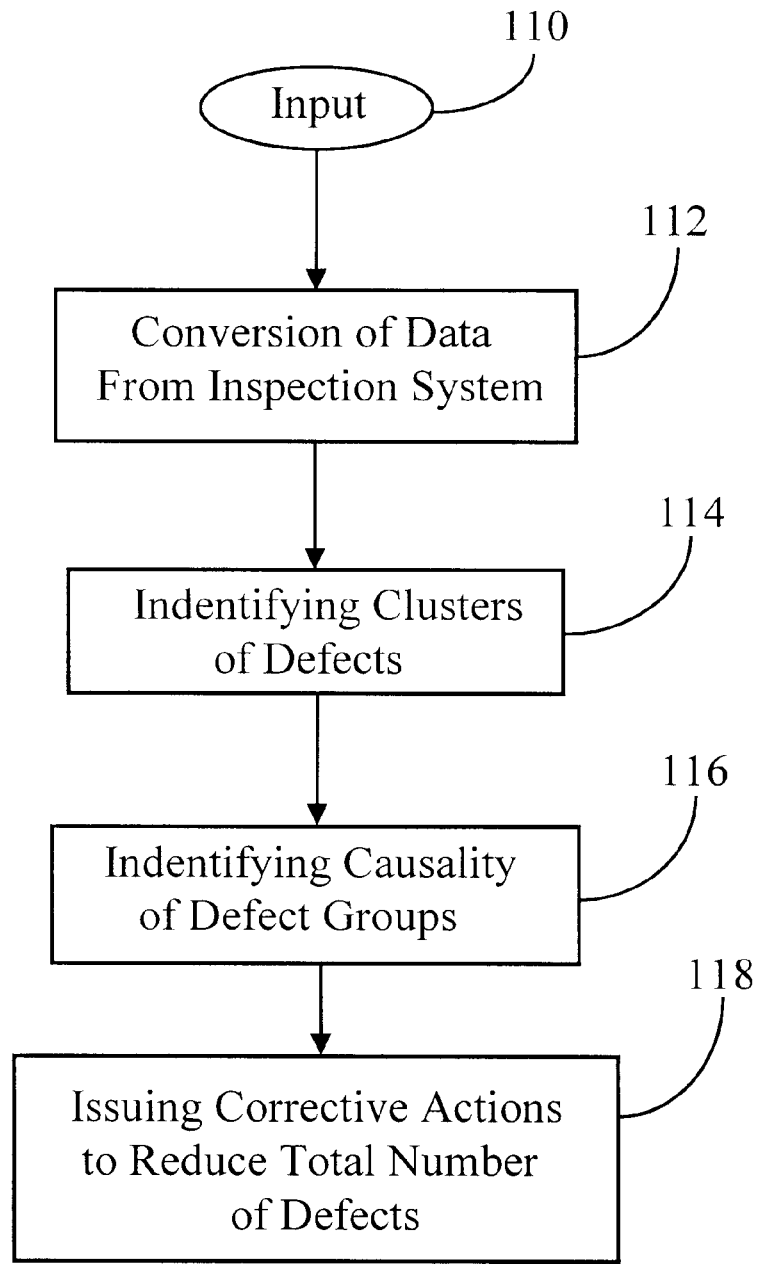
FIG. 3 illustrates a simplified general decision flow of the present invention.

The functions performed by analysis station 102 are summarized in the flow chart of FIG. 3. The data from network data bus 110 is represented here as input 106 with the first function being performed by analysis station 102 at block 112 being the conversion of that data to a form that can be used in analysis station 102 as is discussed more fully below. Next the defects identified by inspection station 100 are grouped together, using various characteristics of those defects provided in the data from inspection station 100, in an effort to cluster together those defects having a high probability of the same causation as indicated by block 114. At this point it should be noted that the term "group" as used in this discussion includes two or more defect events as identified by inspection station 100 that resulted from the same cause.

Block 116 identifies the next function in the sequence that is performed by analysis station 102, that is the identification of the causality of the defect groups identified in block 114. Then, depending on the production control system in the fabrication facility, analysis station 102 either automatically, or in report mode, issues a list of correction action feedback signals or instructions to reduce the total number of defects on later production runs depending on the defect causalities that were determined by analysis station 102.

As will be seen in the discussion that follows, the functions of blocks 114, 116 and 118 of FIG. 3 do not need to be conducted exactly in the sequence as presented here to illustrate the overall function of analysis station 102. For improvements in processing and data handling, a process of elimination like the peeling of the layers of an onion for steps 114–118 has been found to be more efficient as will be seen from the detailed discussion that follows, particularly with respect to FIGS. 10a–10e.

FIG. 11 is a hardware block diagram of one possible implementation of analysis station 102. This implementation includes I/O 300 that is connected between network bus 106 of FIG. 1 and data bus 298 of the analysis station. Connected to data bus 298 are microprocessor 302, RAM 304, ROM 306, hard disk drive 308, floppy disk drive 310, and I/Os 312 and 316. I/O 312 being provided to interface between data bus 298 and keyboard 314 for operator control of the analysis station, I/O 316 is provided to interface between data bus 298 and monitor 318 so that the operator can see what is happening in the analysis station. In this configuration, the data obtained by analysis station 102 is downloaded from network bus 106 via I/O 300 and stored on the hard disk 308. Then under control of microprocessor 302, as will be discussed below, the downloaded data is processed with the assistance of RAM 304 and ROM 306 and then restored in hard drive 308.

As will be better seen in FIG. 10a–10e, there are numerous ways that the defect data can be examined in order to cluster the defects presented by inspection station 100 and to cluster those defects to determine the causation of as many defect groups as possible. As many characteristics of the defects as are determined by inspection station 100 can be used to cluster the defects in an effort to determine the causation of the various groups of defects on the wafers being inspected. As will be seen in FIGS. 10a–10e various of those characteristics are used by the present invention and a suggested ordering of that processing is provided in those figures. Probably the easiest clustering technique to visualize is the clustering of defects strictly spatially. To minimize confusion, the spatial clustering techniques of the present invention are first discussed and then that discussion is generalized to cover other clustering techniques.

Conversion of Data Structure from that of Inspection Station 100 to that of Analysis Station 102

Before the data presented to analysis station 102 can be analyzed in accordance with the techniques represented by blocks 114–118 of FIG. 3, that data must be converted to a format that will minimize processing by analysis station 102. For example, for the spatial clustering technique of the present invention, the defect data needs to be converted to a three dimensional Cartesian format (i.e., two dimensions for individual wafers and a third dimension for the wafer position in the wafer handling cartridge) that is suitable for the techniques of the present invention. A similar technique is employed for feature space clustering techniques of the present invention, as will be seen below. For initial clarification of the technique of the present invention the initial discussion of the technique will address the spatial technique which will be extended to feature space, as well as the other techniques, when FIGS. 10a–10e are discussed.

Figure 4:
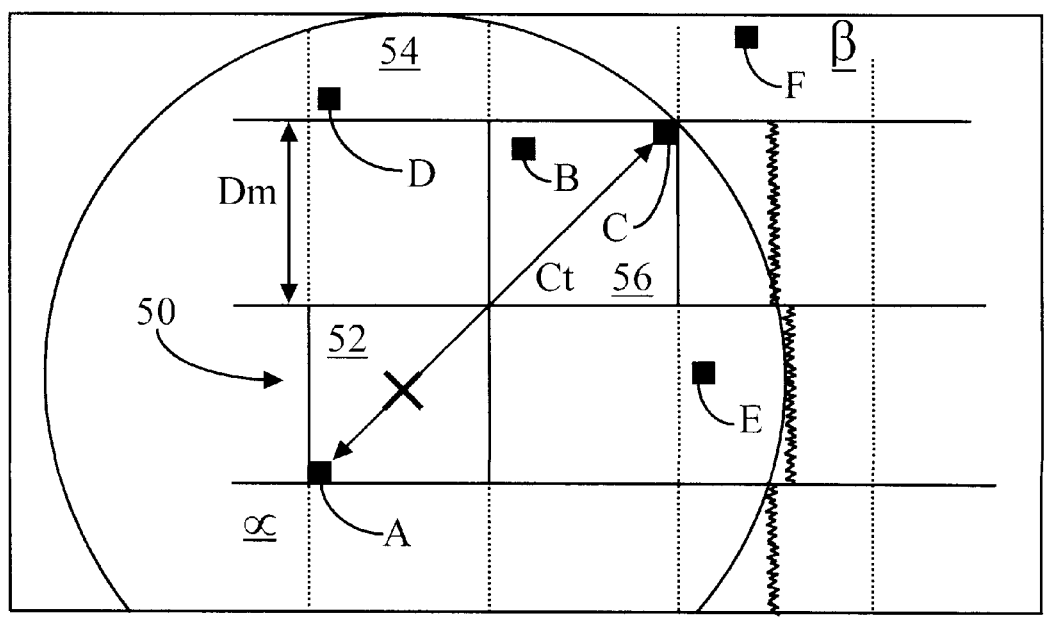
FIG. 4 illustrates the mapping of defect elements from the defect list prepared by the inspection station to a Cartesian grid for use by the present invention.

Referring now to FIG. 4, there is shown a portion of a die that has been inspected by inspection station 100 with defects A–F having been identified. To facilitate the subsequent processing of that defect data by the techniques of the present invention, the defect data must be converted to the format needed by the analysis technique of the present invention (see FIG. 3, block 112).

In FIG. 4, a die is shown divided into quadrangles (i.e, shown here as squares) having sides that are $D_m$ in length. For example, if $D_m$ is 10 $\mu$m a typical wafer would have 42,500×42,500 quadrangles, for a total of 1.8 billion quadrangles which would contain typically a total of 50 to 500 defects; however, on occasion up to 10,000 defects may be experienced. Given those statistics, even if there where the higher number of defects, it clearly would be inefficient to allocate memory capacity in analysis station 102 for each of those $1.8 \times 10^6$ quadrangles, and to store data on each of the defects within each of those quadrangles. To merely try to review which of those data locations had data would take an inordinately long period of time. In addition, the vast majority of those quadrangle data locations would be empty. Therefore the data structure of the present invention has been optimized for the very sparse data that is indeed present.

Because of the large number of defects that may typically occur on a batch of wafers during pilot production, or even in volume production, when the process develops some flaws, it is important that the data structure be well adapted to quickly locate the defects by their location on the wafer and that the method for determining the distance between defects be highly efficient. It is to be noted that given that there are N defects on a wafer (e.g., 1000), the number of distance calculations would be $N^2/2$ (e.g., $5 \times 10^5$). Moreover, it is known that two defects that are more than a few millimeters apart from each other, are unlikely to have the same causal relationship. Therefore both the data structure and the distance calculation technique must be optimized to efficiently identify defect pairs that are likely to be closer together than a critical distance. Then the defect data is thus converted to a data structure consistent with that explained above.

Most inspection machines, since they move the wafer during inspection, create a spatially sorted list of defects as they perform that inspection. Thus, using the serpentine technique as shown in FIG. 2 as an example, all of the defect data for a wafer is presented to analysis station 102 in a list in a single buffer from which the data of each defect is extracted at random. The random extraction from the list is necessary to better produce a balanced tree structure from the defect list, not to create a linked list which will result if the data is simply taken from a sorted list, like that presented by the inspection machine.

Defect Analysis Technique of the Present Invention

A more consistent identification of defects on a semiconductor wafer, as provided by the present invention, make it possible to make changes in various aspects of the manufacture of the semiconductor devices with which it is used, as well as suggesting changes to the inspection, defect review and manufacturing processes; and as to the classification of defects, the detection of defects that occur repeatedly, and the detection of the process steps that constitute the defect causal mechanisms.

A variety of defect properties are typically measured by inspection station 100 during inspection. Examples include defect location in space, location in time, shape, etc. The present invention adds to that, metrics that can be defined to allow the determination of the relative location of defects, either in physical space, or in feature space (feature space being groups of defects based on similarities in defect size, shape, reflectivity, texture, etc.). Application of a threshold to the selected metric further allows the partition of defect sets into feature space clusters whose constituents are relatively "close" to each other in terms of the selected metric.

Thus, the general optimization approach used by the present invention is to identify and isolate those groups of defects which are likely to have a common cause and successively remove the data that represents those groups of defects from the overall population of data to be considered further. In this manner the data of the entire defect population is gradually identified as to causation and removed, thus reducing unidentified data to a set of data that represents random defects not attributable to determinable specific causes and individual defects for later identification.

Experience has shown that defects that are in physical proximity to each other on the wafer, or occur in corresponding locations on different wafers in the same batch, are likely to be due to the same causal mechanism.

In the present invention it is thought that it would be most expeditious, however not mandatory, to first isolate and remove the data that corresponds to defect groups resulting from microscoring, wand marks, brush marks, rail marks, impact marks, hot spots, chemical smear, shower, grain exposure shutter problems, doughnut, haze, etc. The rational here is two fold, first those defects may represent the largest class of defects, and second those defects typically are not isolated singular defects at singular coordinates—they generally result in a group of defects having a singular causal mechanism. Also, defects of mechanical origin are more likely to occur on a specific area of the wafer and in most cases will recur in the same locations on other wafers in the wafer batch. To separate the data that corresponds to those defects from the remainder of the data requires the clustering of the data that is believed to represent such group defects based on the defect characteristics presented by inspection station 100. To perform that clustering, characteristics such as physical spacing, defect size, defect shape, etc., that are typical of defects that are known to occur in a particular production step just completed for the type of material and wafer size being produced by known defect causal mechanisms in those situations are considered.

Another definition of terms used here to avoid confusion is "clustering" or a "cluster" of defects. Earlier a "group" was defined as one or more defects having a common causality. Clusters are the approximation of the present invention to identify those defects that would have been in an actual multiple defect group. Thus, it should be kept in mind that there is a possibility that all of the defects in an actual group may not be in the cluster that corresponds to that particular group and all of the defects in a cluster may not have resulted from the same causality.

One of the difficulties in identifying which defects belong to a particular group and should be in a particular cluster is that sometimes defects that occur at random may also be close to other defects and therefore appear to be part of a group due to a single causal event. To minimize that false identification of a single causal event for a purported cluster of defects, the technique of the present invention defines a cluster in such a way that the probability of misidentifying a number of randomly distributed defects as part of a particular cluster is quite small, while the probability of identifying a true defect group resulting from a singular causal mechanism into a cluster remains high. Additionally the technique of the present invention efficiently segregates the defect population into collections, or clusters, of defects with each cluster likely to have a common cause.

Defect clusters that are constructed by partitioning the defect sites according to relative location in physical space are referred to here as spatial clusters. When partitioning is performed according to relative similarity in feature space, that is referred to here as feature clustering, binning or the definition of classes.

Spatial Clustering

Defect clustering, especially spatial clustering, is a prime component of the technique of the present invention. Spatial clustering for purposes of the present invention is defined to be the identification and collection of defects together in distinct clusters so that all defects within an individual cluster are each adjacent to at least one other defect within the same cluster and each defect can be a member of no more than one cluster, with all reasonable clusters being so identified. Each cluster of defects defined in this way is a "spatial cluster."

A. Definition of a Defect Spatial Cluster:

There are two factors that need to be taken into consideration for the definition of a cluster for the technique of the present invention (see FIG. 4):

| | |
|---|---|
| $C_s$ (Cluster Size) | the minimum number of defects in spatial proximity to each other to constitute a cluster; and |
| $C_t$ (Spatial Cluster Threshold) | the maximum distance within which every member defect site of a cluster must fall to at least one other member defect site of the same cluster ($C_t$ is r in the following equations). |

A primary assumption is that, from a statistical analysis perspective, there are two types of defect producing mechanisms—those that produce defect populations that are highly correlated spatially, and those that produce defect populations which appear to have random spatial distributions. Furthermore, it is assumed that independent analysis of these two populations is useful.

Spatial clustering, as defined above, detects deviations from purely random spatial distributions of defects. Nonetheless, within a randomly distributed defect population, there is some probability that some defects will fall close together, in configurations indistinguishable from actual defect groups (i.e., clustering is the technique of the present invention that is trying to identify the actual groups of defects that have the same causation). The spatial clustering threshold, $C_t$, must be set so that these statistical aberration clusters have a low probability of being detected as clusters.

The problem of automatic threshold setting for spatial clustering may be stated as:

At a given value of minimum defects per cluster, $C_s$, and a specific defect density, n, what is the maximum value of the distance threshold, $C_t$, that yields a low probability of detecting clusters from a purely random distribution of defects.

The inputs to determine the spatial clustering parameters are:

1. A set of defects; and
2. The actual area inspected.

Outputs of the technique are:

1. A cluster size threshold, $C_s$, with clusters containing less than $C_s$ defects are removed from consideration as spatial clusters; and
2. A distance threshold, $C_t$, with defects considered "adjacent" for spatial clustering purposes if the distance between them is less than $C_t$.

The natural tendency is to increase $C_s$ as the total number of defects increases. The initial approach is therefore to set $C_s$ equal to the natural log of the total defect count.

Two approaches to setting the distance threshold, $C_t$ or r, are viable:

1. Spatial clusters are deviations from an assumed Poisson distribution of defects. The threshold must be set so that there is a low probability of detecting clusters in a Poisson distribution of a given defect density. The threshold should be set to the highest value that does not violate the preceding constraint.
2. A histogram of nearest neighbor distances should have a peak near the average distance for a Poisson distribution at a given defect density. Spatial clusters should produce other peaks at lower distances, implying some value of $C_t$.

The first approach has the advantage of being less ambiguous than the second, therefore it is the preferred choice of the present invention.

Figure 7:
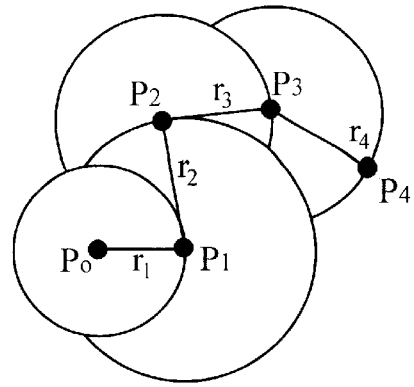
FIG. 7 illustrates the general probability calculation used by the present invention.

FIG. 7 is provided to illustrate the interrelationship of probabilities of specific spatially related defect configurations considering a Poisson distribution. Thus if the cluster size, $C_s$, has been selected to equal two, the probability that a given defect, $p_0$, will be a distance $r_1$ from the nearest neighbor defect, $p_1$, is of interest. Similarly, if $C_s$ has been selected to equal three, the probability, $\rho$, for $C_s$ equal to two must be multiplied by the probability that there is a defect $p_2$ within a distance $r_2$ of the second defect, $p_1$, (but not closer to the first defect, $p_0$, than to the second defect, $p_1$). Thus, it can be seen that as $C_s$ is selected to include more defects in the spatial cluster the probability of there being spatial clusters of that size grows increasingly smaller.

FIG. 7 also illustrates the dependence of the probability on the angles formed between $r_x$ and $r_{x+1}$ when $C_s$ is selected to be greater than two. As can be seen from equation 3 below, the integral over r must not include any of the areas covered by $r_0, \ldots, r_{x-1}$. Thus, the probability of finding a nearest neighbor for some point $p_x$ depends on the exact configuration of defects $p_0, \ldots, p_{x-1}$.

To solve the threshold problem for a given cluster size, $C_s$ equal to N (the minimum number of defects per cluster):

1. Determine the specific probability density function $\rho_{x-1}$ ($r_{x-1}$) (i.e., probability for $C_s$ equal N−1).
   [For example, for $C_s$ equal to two, the probability that there is a defect at $p_0$.]
2. Determine the probability that another point will be within distance $r_x$ of defect $p_{x-1}$.
   For $C_s$ equal to two, it needs to be determined what the probability is that there is a nearest neighbor to $p_0$ at a distance $r_1$:

$$\rho(r) = 2n\pi r \exp(-n\pi r^2) \tag{1}$$

3. Integrate $\rho(r)$ of equation 1 from zero to r, to get the total probability density function.
   For $C_s$ equal to two:

$$p = \int_0^r \rho(r)dr = 1 - \exp(-n\pi r^2) \tag{2}$$

4. Solve the probability function of equation 2 for r to get the threshold function $r(\rho,n)$, $C_t$.
   For $C_s$ equal to two:

$$r = \pm \frac{\sqrt{\log\left(\frac{1}{1-p}\right)}}{\sqrt{n} \times \sqrt{\pi}} \tag{3}$$

5. Set p=desired detection probability, n=defect density, and calculate $r(\rho,n)$.

The functions r(ρ,n) needs to be determined for each value of the cluster size threshold, $C_s$. Specific cases are discussed below.

Equation (1) may be stated more generally:

$$\rho(r) = n \times \text{perimeter} \times \exp(-n \times \text{area}) \quad (4)$$

where the perimeter is the set of points within the area of interest that are at distance r.

For $C_s$ equal to three, the perimeter is:

$$\text{perimeter} = 2\pi r_2 - 2r_1 \text{asin}\left[\frac{\sqrt{(r_1^2(4 - r_1^2/r_2^2))}}{2r_1}\right] \quad (5)$$

The area of a circle that inscribes two defects within that area is:

$$\text{area} = \pi r_1^2 + r_0^2 D_1 \frac{D_2}{2r_1} - r_1^2 \text{asin}\left(\frac{D_2}{2r_1}\right) + 2r_0^2 \text{atan}\left(\frac{r_0^2 D_1 D_2}{-4r_0^2 r_1 + r_1^3}\right) \quad (6)$$

$$D_1 = \sqrt{r_1^2/r_0^2}$$

$$D_2 = \sqrt{4r_1^2 - r_1^4/r_0^2}$$

where $r_x$ can not be greater than $C_t$.

Figure 8:
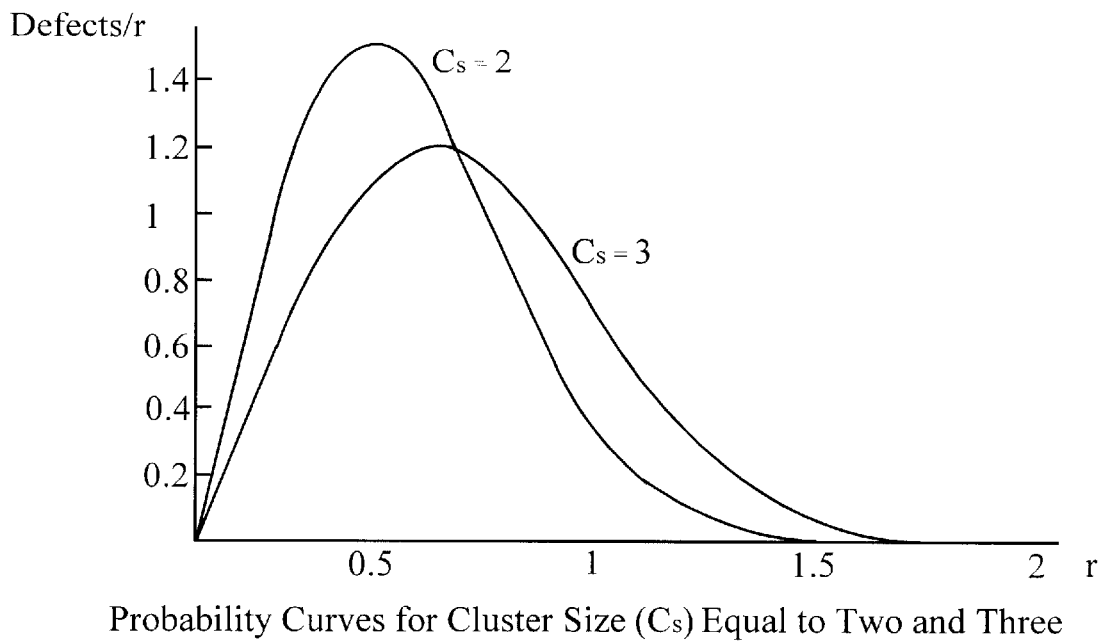
FIG. 8 is the probability density for cluster sizes ($C_s$) equal to two and three.
Figure 10B:
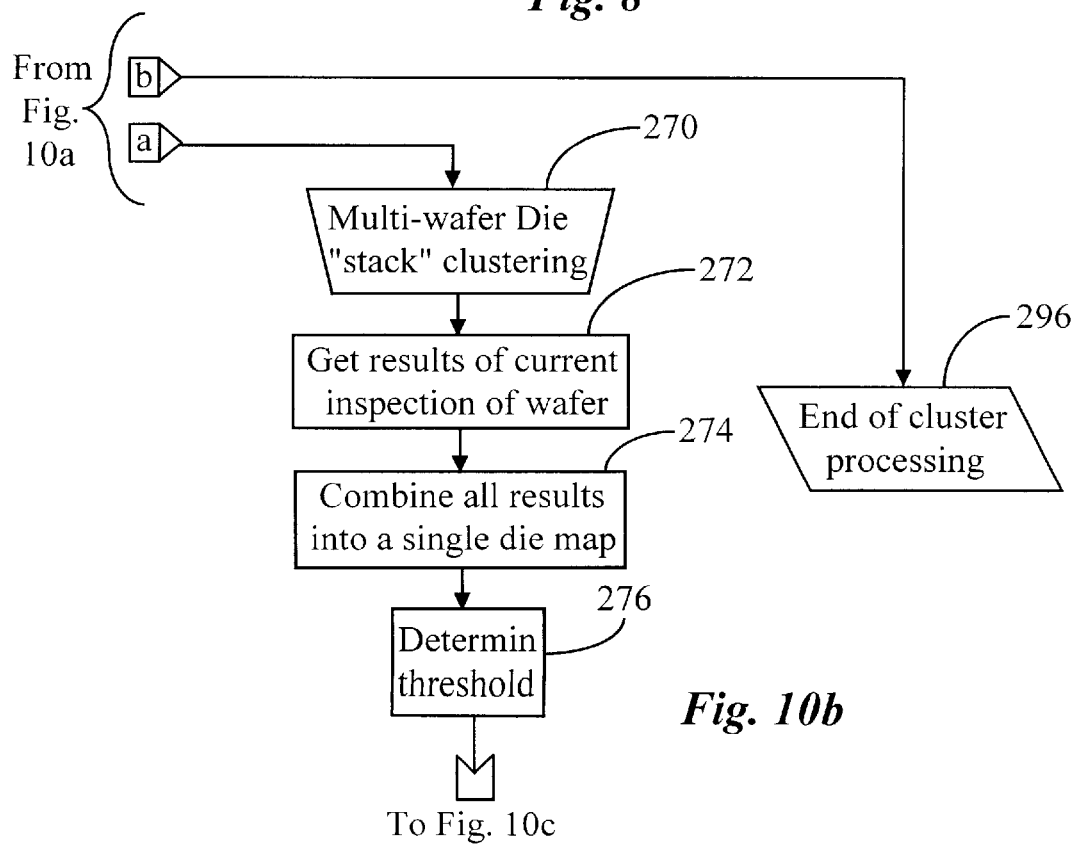
FIGS. 10a–10e is a flow chart of the operation of the analysis station of the present invention.

FIG. 8 is a plot of the probability density functions for specific values of $C_s$ where the x-axis is the distance r and y-axis is the defect density (defects/r).

For an exact solution, the next step is to integrate the total probability function of equation (2) with respect to r for $C_s$ equal to two. The result is then solved for r to give the threshold distance, $C_t$.

By performing that integration, the resulting function specifies, at a given probability, the boundary between distance thresholds that are acceptable and those that are too high. If a threshold that is too high is used, random defects will also be selected as being part of the clusters even thought they are not defects that are associated with the others in the cluster. In other words, getting the exact value of the threshold distance allows the detection of statistically significant spatial clusters at the lowest possible defect group density and excludes defects from inclusion that probably are not members of the same group.

Given an empirically determined bias towards detection of denser spatial defect groups, determination of the exact boundary is not necessary. It has been determined that the precise location of the threshold distance is not necessary since defect groups are typically very dense compared to the distributions that they are embedded in.

An examination of the probability functions of equation (4) and FIG. 7 indicates that a reasonable approximation of the total probability function for $C_s$ equal to N is:

$$P_N(r,n) = (1 - \exp(-n\pi r^2))^N \quad (7)$$

In general, solving equation (7) for r gives the threshold function as:

$$r_N(p, n) = \frac{\sqrt{\log\left(\frac{1}{1 - p^{\frac{1}{N}}}\right)}}{\sqrt{n}\sqrt{\pi}} \quad (8)$$

where p is the selected probability that all defects will be within the same defect group, n is the specific defect density measured by the inspection station 100, and N ($C_s$) is the minimum number of defects per cluster.

Equation (8) thus expresses the radius, r, or $C_t$, as a function of the selected probability and the measured defect density.

B. How Spatial Defects are Clustered:

It is to be noted that with the technique of the present invention, as will be seen from the following discussion, in the overwhelming majority of cases for semiconductor wafers the true distance between two defects does not have to be computed if one merely wants to determine whether two defects are farther apart than a given distance. Using the notation of FIG. 4, if it is known a priori that one defect falls into quadrangle α with another defect falling into quadrangle β and that the two quadrangles are more than the distance $C_t$ apart from each other, there is no need to exactly compute that distance as will become clear as the discussion progresses.

The data structure of the present invention, as explained above, identifies quadrangles that contain defects and provides a list of defects within each of those quadrangles. Further, the size of the quadrangles is critical since it affects the efficiency of the distance measurement and of the retrieval of defects that are a group of defects resulting from a common causal relationship. Thus the size of the quadrangle depends on two parameters: $C_s$ (cluster size) and $C_t$ (cluster threshold).

For the technique of the present invention these two interrelated parameters, $C_s$ and $C_t$, are chosen such that the probability of misidentifying randomly occurring defects that are separated spatially by a distance of at least $C_t$ as being members of a spatial cluster is low, while at the same time the probability of correctly spatially clustering non-randomly distributed defects in an area that have the same causal relationship remains high.

For a given defect density one may calculate the probability of $C_s$ randomly distributed defects forming a spatial cluster with a spatial cluster threshold of $C_t$ as discussed above.

Once the cluster size, $C_s$, and the cluster threshold, $C_t$, are determined, the necessary size of the quadrangles can be determined since, as shown in FIG. 4, the diagonal dimension of each quadrangle is ½$C_t$. Thus, the length of the side of each quadrangle, $D_m$, is equal to the square root of $C_t$. Given that relationship between $D_m$ and $C_t$, the potential data locations for the two surrounding layers of quadrangles in each direction, when considering a single die (i.e., only twenty-four quadrangles), have to be searched to determine whether, for a given defect X in quadrangle 52, there are other defects within the distance $C_t$ of defect X.

No measurement needs to be made between defect X and any defect in one of the eight quadrangles juxtaposed to, and that surround, quadrangle 52 since those quadrangles in their entirety are within the distance $C_t$ of every location in quadrangle 52. However, the distance from defect X to defect D in quadrangle 54, or another defect in another second tier quadrangle (i.e., second layer of quadrangles) would need to be calculated to determine if it where within the distance $C_t$ of defect X. However, if there is another defect (e.g., defect B in quadrangle 56) in one of the first tier of quadrangles that is intermediate defect X and a third defect (e.g., defect F in quadrangle β) in a second tier quadrangle from defect X, then those three defects are all within the same spatial cluster (e.g., defect B is within $C_t$ of defect X, and defect B is within $C_t$ of defect F) thus no distance calculation is needed to so identify those three defects as being in the same spatial cluster. The data structure and quadrangle division of the surface of the wafer is all that is necessary in this example, and in most cases as stated above.

For those defects that are not in adjoining quadrangles and are not in quadrangles that are more than two quadrangles away from another defect, a calculation of the distance between the two defects must be made to determine if the two defects are within $C_t$ of each other. This can be done by using the x and y defect position information from the inspection station 100 for each of those two defects using the standard Euclidian distance calculation equation of (9) as follows:

$$d = \sqrt{(x_0 - x_1)^2 + (y_0 - y_1)^2} \quad (9)$$

where $x_0$ and $y_0$ are the coordinates for one defect, and $x_1$ and $y_1$ are the coordinates for the other defect.

To understand the technique of the present invention the reader's attention is directed to FIGS. 5, 6a–6d and 9a–9c. In the data optimization structure of the present invention one memory location has been assigned for each column of quadrangles 50. Each of those memory locations contains a pointer to the root of a "tree" of data that stores the x- and y-coordinates of those defects with respect to the tree root in each memory location as will become clear from the discussion of FIGS. 9a–9c. The leaves of the tree are the y-coordinates of the defect. (Trees of this type are described on pages 1535–1538 of "Encyclopedia of Computer Science and Engineering" by Anthony Ralston, Editor & Edwin D. Reilly, Associate Editor, Second Edition, Van Norstand Reinhold Company, Inc. New York, 1983.)

Figure 5:
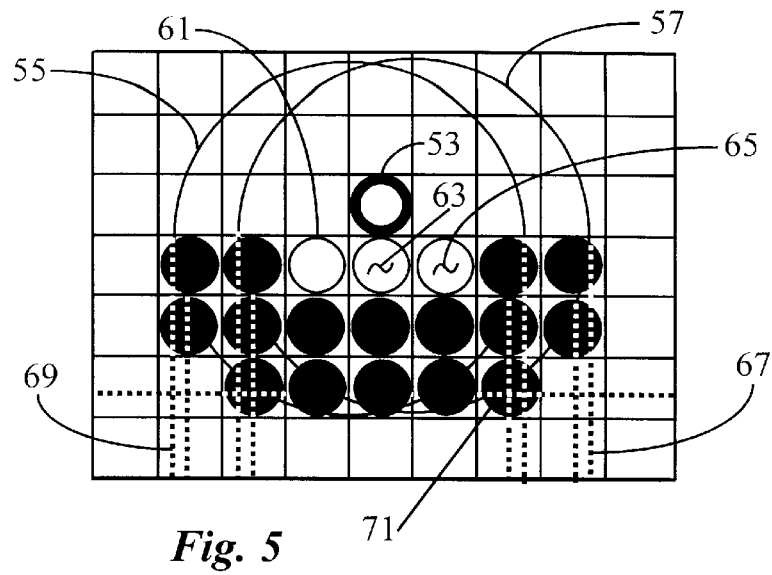
FIG. 5 illustrates the clustering technique of the present invention that minimizes the need to perform actual distance calculations between defects.

An exhaustive search pattern is shown in FIG. 5 with that search starting in the quadrangles at the top of that pattern and progressing downward until a quadrangle containing at least one defect is detected. Here, quadrangle 53 contains a detected defect that is shown as a black dot with white center. Since the search progresses from top to bottom, the quadrangles above and to either side of quadrangle 53 are considered to either not contain defects or to have already been processed. Thus, the adjacent quadrangles 61, 63 and 65 of interest are those three with circles in the quadrangles adjacent to quadrangle 53 and in the next lower row. Also shown are $C_t$ radius threshold circles 55 and 57 with the center of those circles being the lower two corners of quadrangle 53. Thus, the potential quadrangles to which the distance from a defect in quadrangle 53 may have to be measured is limited to those quadrangles containing the black dots.

Figure 6A:
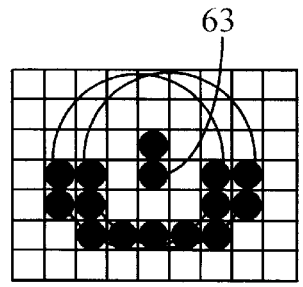
FIGS. 6a–6d are each a special case to illustrate the method depicted by FIG. 5.

Of quadrangles 61, 63 and 65 (i.e., those containing the circles), if only quadrangle 63 also includes a defect, then the only black dot quadrangles of FIG. 5 to which a measurement may have to be made, if the black dot quadrangle contains a defect, are those black dot quadrangles that are shown in FIG. 6a if the quadrangles juxtaposed to quadrangle 63 in the same and next lower row do not also contain a defect.

Figure 6B:
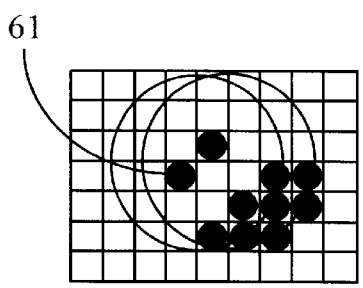

Similarly, if only quadrangle 61 also includes a defect, then the only black dot quadrangles of FIG. 5 to which a measurement may have to be made, if the black dot quadrangle contains a defect, are those black dot quadrangles that are shown in FIG. 6b if the quadrangles juxtaposed to quadrangle 61 in the same and next lower row do not also contain a defect.

Figure 6C:
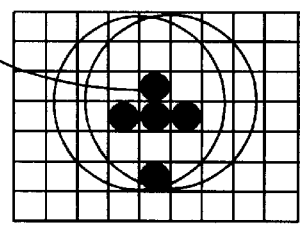

Additionally, if all of quadrangles 61, 63 and 65 each also includes a defect, then the only black dot quadrangle of FIG. 5 to which a measurement may have to be made, if that black dot quadrangle contains a defect, is the black dot quadrangle three rows immediately below quadrangle 53 as shown in FIG. 6c if the quadrangles juxtaposed to quadrangles 61, 63 and 65 in the same and next lower row do not also contain a defect.

Figure 6D:
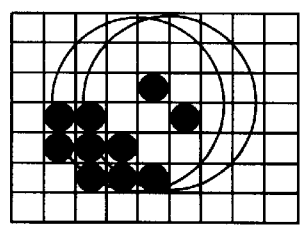

Further, if only quadrangle 65 also includes a defect, then the only black dot quadrangles of FIG. 5 to which a measurement may have to be made, if the black dot quadrangle contains a defect, are those black dot quadrangles that are shown in FIG. 6d if the quadrangles juxtaposed to quadrangle 65 in the same and next lower row do not also contain a defect.

Figure 9A:
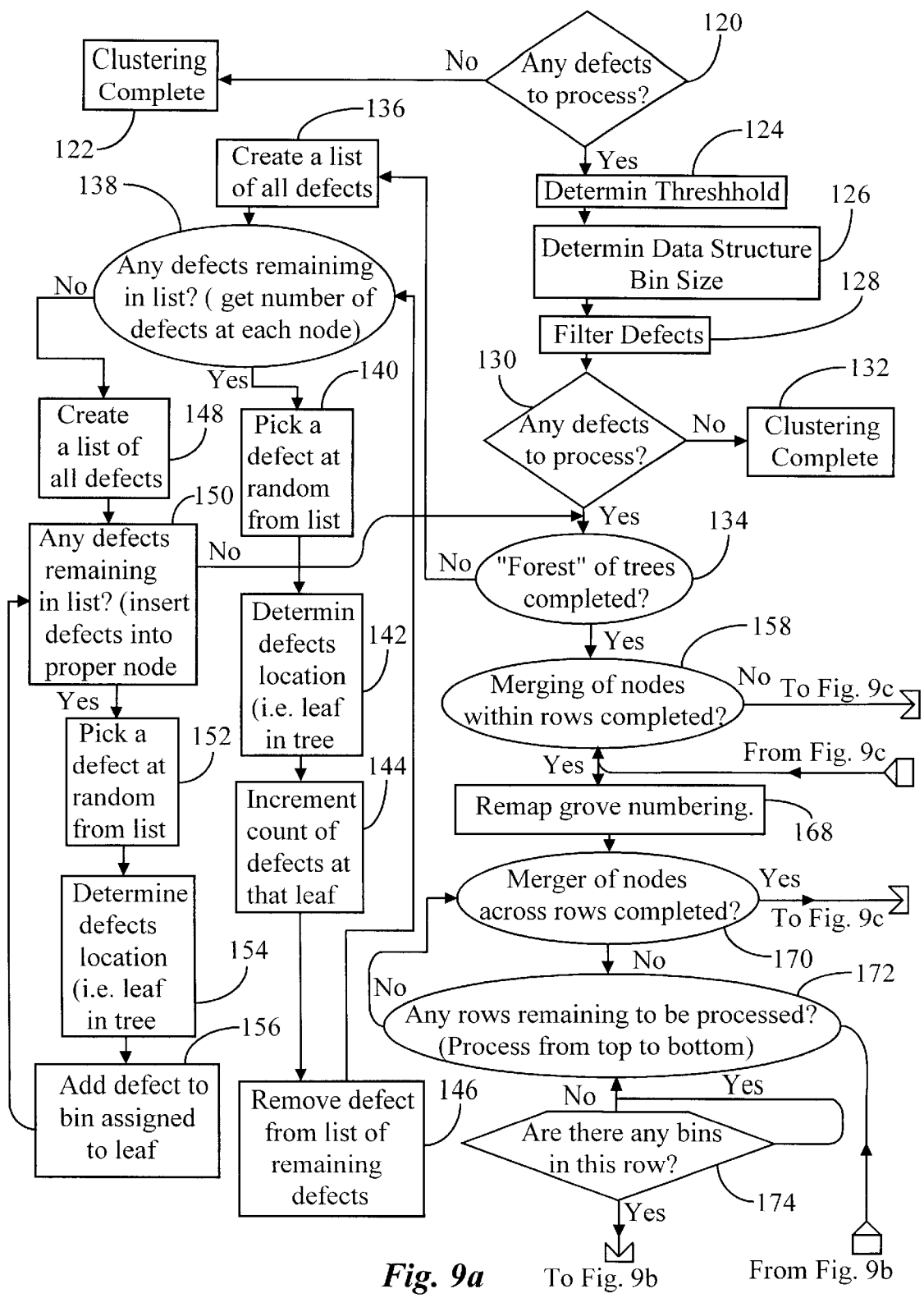
FIGS. 9a–9c is an optimized flow chart that illustrates the defect clustering algorithm of the present invention.
Figure 9B:
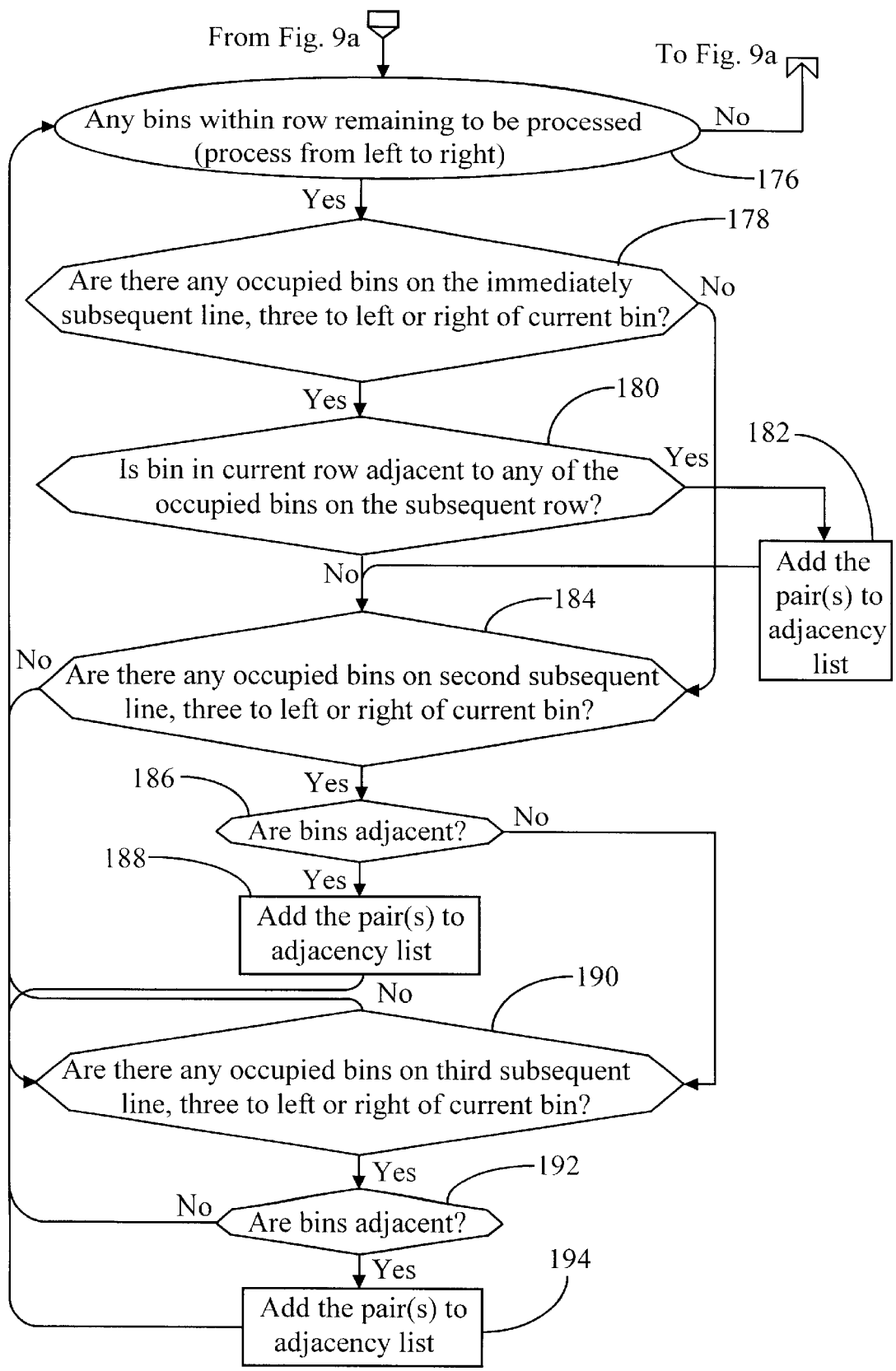
Figure 9C:
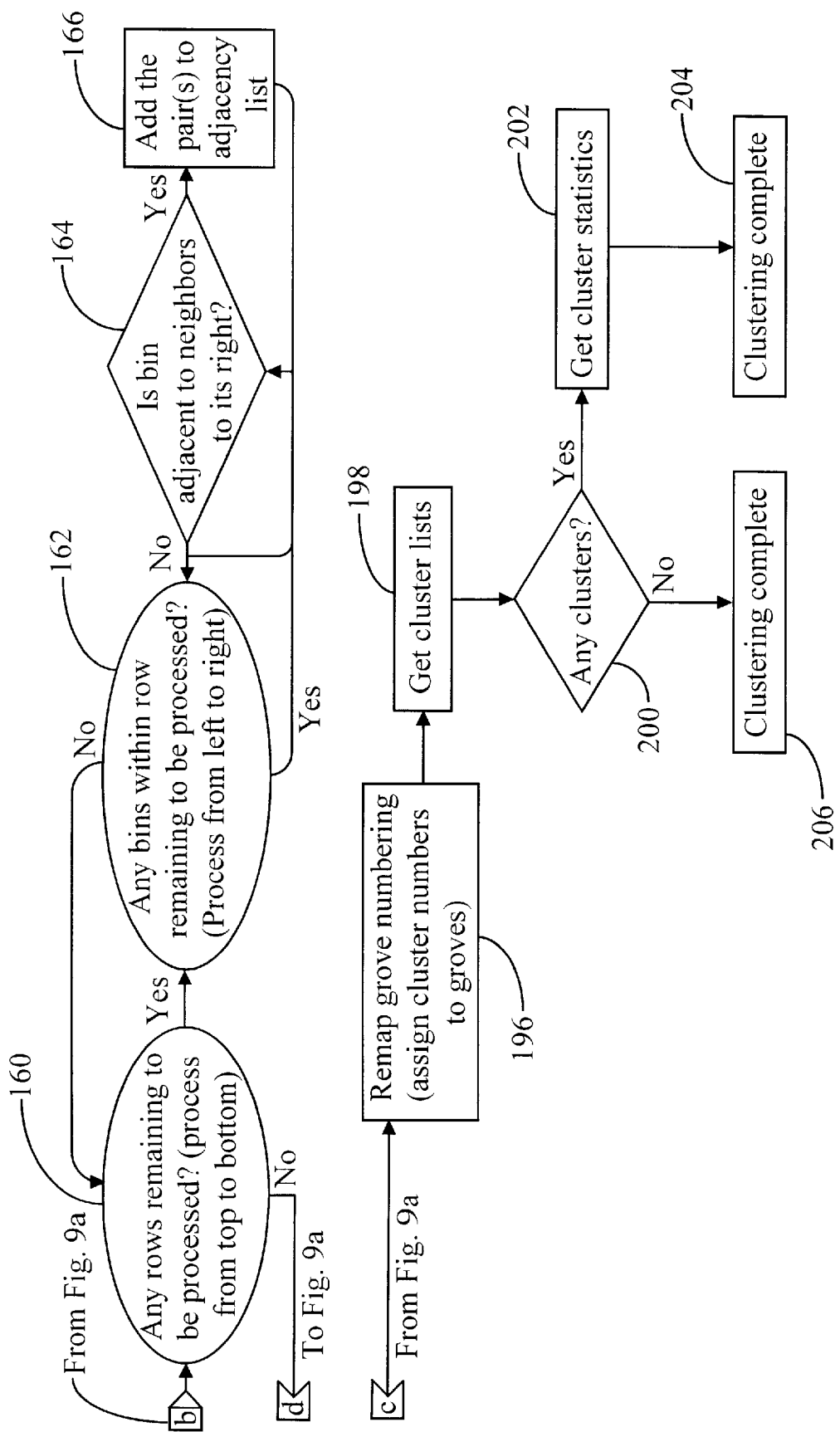

The details of the distance clustering technique of the present invention that, in part, produces the inspection routine described above with respect to FIG. 5 is shown in more complete detail in FIGS. 9a–9c. Here the defect data from inspection station 100 is examined to determine if there are any defects (block 120). If no, then the clustering is complete (block 122), and if yes the cluster threshold, $C_t$, is determined using equation (8) above. From the value of $C_t$, the length, $D_m$, of a side of a quadrangle, or bin, of interest is determined (block 126) as discussed above (see FIG. 4).

To further reduce the number of distance calculations that need to be performed the adjacency search technique of FIG. 5 can optionally be extended further in the quadrangles that are the third quadrangles in either the horizontal or vertical directions from the quadrangle of interest, quadrangle 53. This is done by extending straight lines 67 or 69 downward from the points where circles 55 or 57 intersect the top edge of each lower row of quadrangles. For that row of quadrangles then any defect that is further to the left or right than lines 69 and 67, respectively, is clearly not within $C_t$ of quadrangle 53. However, it is still possible that points closer to quadrangle 53 than lines 67 and 69 and that are also within the quadrangle through which line 67 or 69 passes may still be further than $C_t$ from the defect in quadrangle 53. Thus only those defects that are closer to quadrangle 53 than line 67 or 69 and within the quadrangles that are third from quadrangle 53, left or right, need to have the distance calculated using equation (9).

Similarly, a line 71 that is tangent to the lower edge of circles 55 and 57 can also be drawn in the row of quadrangles that is the third row below quadrangle 53. Thus, all points below line 71 are automatically more than $C_t$ from the defect in quadrangle 53, while equation (9) must still be used to calculate the distance from quadrangle 53 for any defect in the third row of quadrangles that are closer to quadrangle 53 than is line 71.

As will become clear when the complete clustering technique of the present invention as shown in FIGS. 10a–10e is discussed, the clustering routine that is being discussed here with respect to distances between clusters to minimize confusion, will also be used with other parameters (e.g., in feature space using defect size) thus a filter defects step (block 128) has been included to remove defect data that has already been identified as being in a cluster from further consideration on this pass through the data. Therefore if distance clustering is the first pass through the data, no data will need to be filtered. In keeping with the filtering generality, a decision step (block 130) is included to determine if there is any data left to be considered following the filtering. If there is no additional data then clustering is complete (block 132).

If there is still data available, control proceeds to block 134 to determine if the data acquired from inspection station 100 has been converted to a form that can be used in the clustering operation of interest here as discussed above. This operation is being called a "forest of trees" as discussed above with respect to the Anthony Ralston reference. If the data conversion has not been completed, then flow proceeds to block 136 to begin the data conversion to create the trees. In a first pass through the data the individual "leafs" are examined to determine how many there will be in each quadrangle that is occupied to allow for the allocation of storage space for the data in the various occupied bins or quadrangles. Then a second pass is made to actually place those defects in the bin of interest.

In the first loop, it is first determined if there are any defects remaining in the list (block 138), if so a defect is picked at random from the list (block 140) and it is determined what will be the appropriate quadrangle for that defect (block 142) (e.g., using x and y coordinates if the clustering is being done spatially) and the count for that quadrangle is incremented (block 144) and that defect is then removed from further consideration in the first pass (block 146) and control is returned to block 138 to determine if there are any more defects to be processed. When the first pass is completed the answer from block 138 will be negative and the bin sizes have been set. Control then moves to the second loop where block 148 functions similarly to block 136 and the actual data is entered into the appropriate bins, or quadrangles, by the operation of blocks 150 through 156 with the flow returning to block 150 from block 156 each time. Once the data is entirely processed and the data conversion produces the complete trees, and block 150 returns control to block 134 where a yes response will now be generated and flow proceeds to block 158 where the testing begins tree by tree.

Blocks 158 through 166 begin by merging defects within a row, a row at a time. To perform this test each bin in the row initially has a unique number of defects (i.e., 0 or more) and if defects in two bins are found to be of the same cluster (block 164), an adjacency list is created (block 166) indicating which bins contain defects that are of the same cluster. Then when the row is completed, control returns to block 160 to determine if there are any additional rows to be processed, if there are, then blocks 162 through 166 are revisited, otherwise control is returned to block 158 and the processing proceeds to block 168 where the defects in each adjacent bin are renumbered as being in the same "grove" or cluster.

Next the trees are examined to determine if merger between the rows has been performed (block 170). If not then control proceeds to block 172 and the multiple loops dependent therefrom (blocks 174 through 194) to process the defect data as was outlined in the discussion of FIGS. 5 and 6a–6d above. If there are rows that have yet to be processed with respect to each other, control proceeds to block 174 where the next row is examined to see if there is a defect occupied bin in the corresponding row. Those bins are then tested to determine if they have already been processed (block 176), if yes control returns to block 172 and if no, control proceeds to block 178. At block 178 it is determined if there are any defect-occupied bins in the next row down that are within three bins, or columns, to the left or right of the bin of interest in the previous row. If no, control skips to block 184, and if yes control proceeds to block 180 where it is determined if the bins in the first and second rows are juxtaposed to each other. If they are, those bins are added to the adjacency list (block 182) before control proceeds to block 184, and if not, control proceeds to block 184. At block 184 the bin of interest from block 176 is compared to bins, either three bins to the right or left, in the second subsequent row. If the response in block 184 is no, control skips to block 190, and if the response to block 184 is yes, the bins are checked to see if they are adjacent (block 186). If the response here is no, then control jumps to block 190 and if the response is yes, those bins are added to the adjacency list (block 188) before control proceeds to block 190.

At block 190 the bin of interest is compared to bins in the third subsequent row, three bins to the left or right of the current bin. Here if the response is no, control returns to block 176, and if yes, control proceeds to block 192. From block 192, if the bins are adjacent, the defect pair is added to the adjacency list (block 194) before returning to block 176, as it also does if the response at block 192 is no. Thus, when all rows in all trees are processed with respect to each other, control returns to block 170 through blocks 176 and 172, and then on to block 196.

Then at block 196 the groves are remapped to the identified clusters (block 198). Then the data is tested to determine if there where any clusters detected (block 200). If not then clustering is complete (block 206), and if yes the cluster statistics are developed to identify which defects are in which cluster (block 202) and then clustering is complete (block 204).

In summary then, what has gone before is the processing of the defect data with a cluster consisting of the identified groves, with each grove consisting of adjacent bins, and each bin consisting of identified defects so that the defects that are included in each cluster can be identified by tracing backward through the processing discussed here.

C. Spatial Cluster Properties Calculated During Spatial Clustering:

The present invention uses cluster properties determined during spatial clustering as an input to make various decisions. For example, by examining the properties (e.g. similarities and differences) of the defects identified as belonging to the same cluster, a signature will emerge that will greatly help identify the source of the defects within that cluster. That same examination may also help to identify which, if any, of the defects identified as belonging in that cluster may not have been properly assigned to that cluster. A non-exhaustive list of the specific spatial cluster properties that provide that signature of the defects within the cluster are listed in TABLE II. This also will vary with the specific inspection and review machines and the specific process control application.

TABLE II

Examples of Cluster Properties

| Property | Description of Calculation |
|---|---|
| Defective Area | Sum of area of defects in the spatial cluster. |
| Cluster Area/Size | Total area covered by spatial cluster, number of die affected by spatial cluster, total number of defects in spatial cluster. |
| Defect Density | Defects per unit area of the spatial cluster. |

TABLE II-continued

Examples of Cluster Properties

| Property | Description of Calculation |
| --- | --- |
| Defect Location | With respect to wafer and with respect to die; obtained from stage location at the time of defect detection and known location of wafer alignment point(s) and measurement of die pitch. |
| Cluster Shape | Map spatial cluster to a sampling grid, and treat spatial cluster as an image. Perform morphological operations on image and measuring circularity, linearity, multiple components, concavities, convexities. |
| Cluster Density | Average density, variation in density within spatial cluster (from density histogram), unimodality of density distribution, circular symmetry of the density distribution, measure of skew of the density distribution. |
| Cluster Location | Spatial cluster center with respect to edge of wafer or wafer center, location with respect to sector of wafer measured from notch or flat of the wafer. |
| Defect Size Distribution in Cluster | Size histogram |
| Defect Intensity Distribution | Defect intensity histogram |
| Defect Shape Distribution | Defect shape histogram |
| Defect Polarity Distribution | Number of positive and negative defects n (with respect to reference image.) |
| Defect Texture Distribution | Defect texture measure histogram |
| Defect Edge Roughness Distribution | Edge roughness histogram |
| Defect Compactness Distribution | Defect compactness histogram |
| Defect Context Distribution | Defect context histogram |

D. Defect Properties Calculated Based on the Results of Spatial Clustering:

A set of derived properties may be assigned to individual defects that occur in a spatial cluster, based on their relationship to other defects in the spatial cluster. For example, the deviation of area for a defect in a spatial cluster is calculated by taking the difference between the defect area and the mean defect area of all defects in the spatial cluster. The difference is specified in units of standard deviations from the mean.

For each property of an individual defect in a spatial cluster, a derived property may be defined that relates the property of a singular defect to the average of these properties taken over all defects in the spatial cluster (see TABLE I).

Generalization of Clustering

Up to this point the discussion of clustering has substantially been limited to the processing of data that is identified by the an x- and y-coordinates of that data with the data bins in FIG. 4 laid out in that manner. The same clustering routine can be used for the data presented in any other one, two, or more dimensional organization using the defect data properties presented by inspection station 100 and as summarized in Table I. For example, mention was made above of "feature space". "Feature space" clustering can be performed by selecting two features from Table I, one to be plotted against the other on the vertical and horizontal axes of FIG. 4 (e.g., defect size and shape, intensity and polarity, compactness and shape, etc.). In any of those systems, the definition of $C_s$, the cluster defect density, remains substantially unchanged as does the definition of $C_t$. the cluster threshold, with the "distance" equivalent being a measure of the bins in each direction. Thus, in feature space the bins would be processed as discussed above for the spatially disposed defects.

One more specific example of the use of clustering is through the clustering of bit map data from an electrical tester. The electrical tester presents a page of memory that may contain as many as 2,000 data bits. By spatially clustering those individual defects where there is a group of defects in a particular location, those that are close together most probably have a common cause and therefore in reality represent one electrical failure, e.g., LTX Micro-Master Delta 50–100.

Clustering of die failures from electrical test data can also prove helpful. In some electrical test systems, each die on a wafer is electrically tested following the final processing step of the wafer and before the wafer is diced to produce the individual components. In those electrical tests, a code is generated for each die with the various codes denoting whether the die passed the test, or denoting the type of failure that was experienced with those dies that failed the electrical test. That pass/fail code is generally referred to as a "bin code" with each die having its own bin code. Thus, since a typical wafer will have 150 die, there will be 150 data entries for that particular wafer. This collection of "bin codes" for an individual wafer, or those for multiple wafers from the same production run, can be clustered in many ways. It could be spatial clustering, failure code clustering, a combination of the two, or a combination with any other feature or time that may prove revealing of the defect cause that is at work on that wafer, or those wafers, this applying clustering at the die and electrical die levels.

Yet another example is through the use of DSA (Defect Source Analysis), i.e., looking at inspected features and locations of defects on the same wafer at different points in time, or in the manufacturing process. For example, a wafer may undergo six processing steps and electrical test with optical inspection between each of the processing steps. Each of those inspections thus produces a defect map at a particular point in time. Thus, time is another feature of the same physical wafer, therefore the stacking those defect maps provides DSA. This is in effect the stacking of the individual defect maps with respect to time. The result is that the feature axis used for clustering are time, defect features that are selected (e.g., size, spatial, etc.), and perhaps dies, reticle fields, or even distinct wafers if data from more than one wafer is used in this way.

Issuing Corrective Actions to Reduce Number of Future Defect Counts

Based on the distribution of defect cluster sites identified with the techniques of the present invention, improved decisions regarding inspection, review, and manufacturing processes can be made to both reduce the number of defects and to provide additional information for use in the analysis operation to better identify the defects that are then occurring.

Control of any manufacturing process requires feedback, as is commonly known. To effectively perform that function, at various points in the manufacturing process, the state of the process must be assessed and compared against expectations and requirements.

Thus, the clustering results presented by the present invention can be used to enhance the manufacturing process control for semiconductor wafers in many ways. Some of the ways that clustering performs that function are as follows:

1. Improve the utility of the defect count used for review sampling, SPC, etc., by spatially clustering defects.
2. Improve the utility of the defect count used for review sampling, SPC, etc., by grouping defects using properties measured during inspection.
3. Improve review speed and utility by removing human subjectivity from the selection process used to choose the sample of the defects that are to be reviewed.
4. Improve the review sample selection process by selecting from the spatially clustered and unclustered defect populations independently.
5. Improve the review sample selection by treating other automatically detected subclusters of defects independently (e.g., divide the unclustered defect population into clusters based on size, and sample from each size cluster independently).
6. Improve the review sample selection process by sampling through the use of sequential sampling, changing the sample set (or terminating review) as information is acquired.
7. Improve the accuracy of detection of repeating defects by removing clustered defects from the population to be analyzed.
8. Improve the accuracy of defect classification by analyzing the properties of defect clusters and the properties of their constituent defects.
9. Improve inspection utility during initial stages of process development by allowing independent analysis of clustered and unclustered defects.
10. Improve inspection utility by clustering data from multiple wafers, allowing for detection of clusters that occur repeatedly on a number of wafers, and detection of defects that occur repeatedly at the same location on multiple wafers at a low frequency.
11. Improve review utility by relating defect distributions in a given set of manufactured articles (e.g., a semiconductor wafer) to similar defect distributions encountered on previously inspected sets.
12. Improve inspection utility by applying clustering to defect source analysis.

This aspect of the present invention is outlined below for the specific example of semiconductor wafer fabrication. In the following discussion, "Output" is that information that is made available to subsequent analysis steps, or to any external system such as a Statistical Process Control system. Additionally, various subsets of the following process technique may individually improve inspection and review utility independent of other steps in the process.

Improved Review Process and the Identifying of Defect Group Causations

Extending the techniques of the present invention to other clustering routines creates additional techniques that can result in an improved and more complete process for the identification of the various defect groups that may be present with various routines which are better at identifying certain defect groups than others. Given the types of defects that are typically encountered, these various clustering techniques may have an optimum order to present the best yield possible. It needs to be remembered however that all techniques are not always necessary, that the same ordering does not always present the best results, and that as wafer processing techniques and methods change the defect analysis techniques necessary to best identify the groups and causes of those defects may also change.

Given that, any one of the techniques discussed below and illustrated in FIGS. 10a–10e can be performed independently of any other, or in any order that is desired. The ordering that is discussed here at the present time is an optimized ordering that produces the best results for the average wafer produced by the currently known processing techniques.

Given the properties described in the preceding paragraphs as inputs, the improved review process of the technique of the present invention is discussed here in conjunction with FIGS. 10a–10e. The system begins in FIG. 10a with the acquisition of defect data (block 208) from inspection station 100. Next the data passes through block 210 to determine if it has been fully processes by all of the paths of analysis and then progresses to block 211 where the data is directed to the analysis paths in the order of interest.

Assuming that the order of interest is from the paths on the left to those to the right, the data on the first pass is directed to block 212 which is designated "large defect detection". This analysis technique corresponds to the spatial clustering that has been discussed at length above with the data being obtained (block 214), the threshold, $C_t$, being determined, the clustering being perform as discussed above with respect to FIGS. 9–9c, and the results stored (block 280).

Here spatial clustering on the entire set of defects on the wafer is performed using a small clustering threshold distance, $C_t$, to detect very large defects with the properties of the defects in each cluster being verified that all defects in the same cluster resulted from the same causal mechanism (blocks 282–294. Each cluster detected in this step is considered a single defect in subsequent processing. With the number of clusters detected (i.e., the number of large defects found), their causes if known, the number of defects in each cluster, the identifiers of their constituent defects, and the corrected defect count are stored by block 280.

Then the defect data that corresponds to those defects detected and identified in this first pass are removed from the data set by block 210 before control is directed to block 220 for the feature space clustering operation.

This operation, feature space clustering, is similar to that of the spatial clustering operation using a two, three, or more dimension space created using non-spatial features measured by inspection station 100 with or without the spatial information.

The data that is identified as being in the clusters identified here is similarly removed from the data set remaining after the spatial clustering operation before the next phase of data reduction is begun. If there was sufficient reason for doing so, the analysis process could return to the large defect detection routine of the first column if that served a useful purpose. That might be necessary if some of the defect clusters that are detected and the corresponding data removed during the feature space clustering were known to mask large defect groups where $C_t$ would have to be larger than could originally have been selected during the first pass through the spatial clustering routine.

Figure 10A:
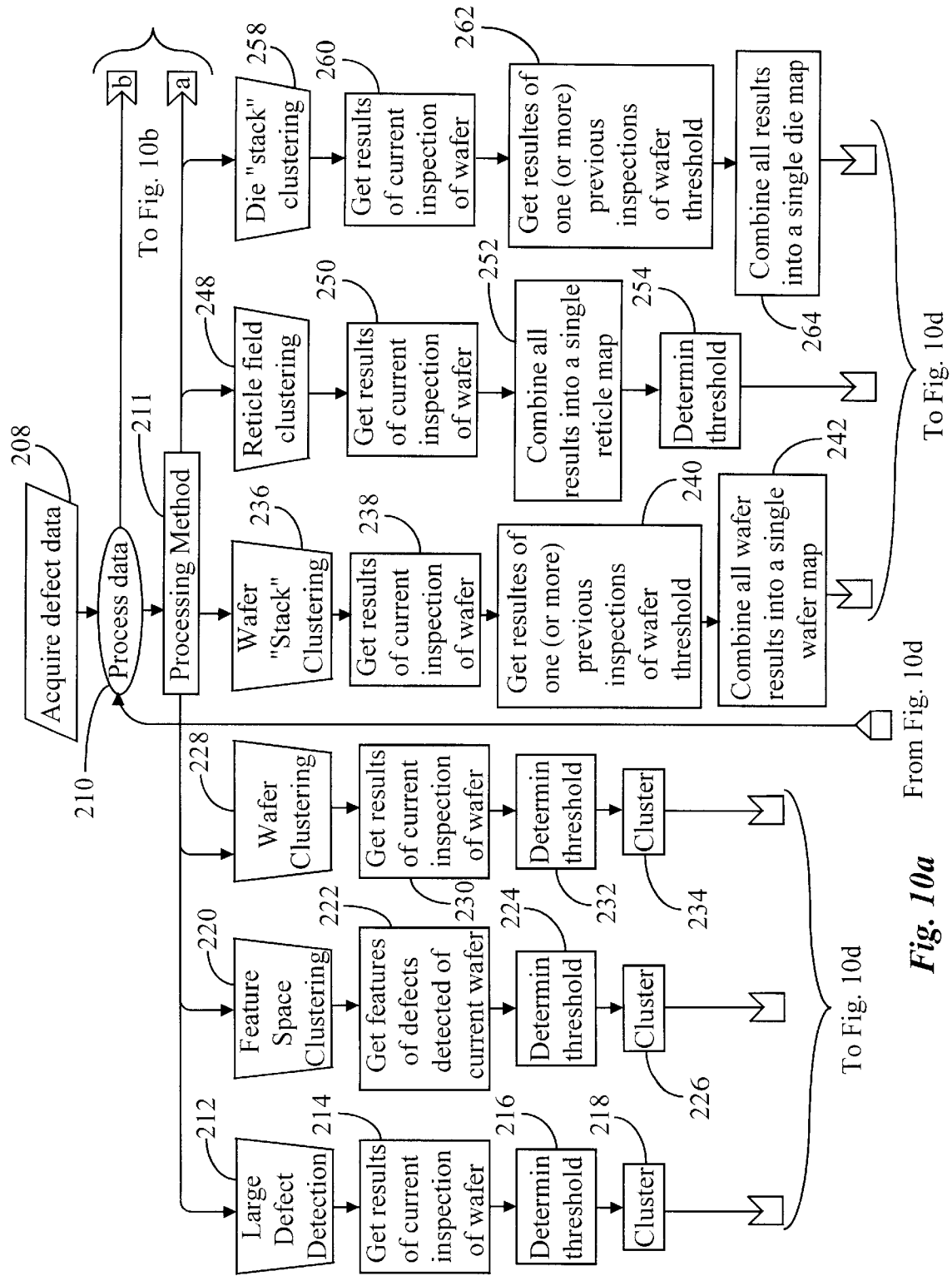

From FIG. 10a that next step is identified here as "wafer clustering" where the clustering is limited to a single two dimension wafer surface, where the first two routines—large defect detection and feature space clustering could be performed over multiple wafers in three or more dimensions. Thus, wafer clustering as used here could be thought of as spatial or feature space clustering, or a combination of the two, limited to the surface of a single wafer. This then might perform the repeated spatial clustering operation that was described above where it was suggested that it may be of interest to return to spatial clustering following feature space clustering. Thus, wafer clustering proceeds as outlined here in steps 228–234 and 280–294 with the results also stored at block 280.

Following this operation, as with the previous two, the defects included in the identified clusters here are removed from the data obtained from the wafer clustering operation before proceeding to the wafer "stack" clustering operation beginning with block 236. It should be known that in the processing of semiconductor wafers, a number of wafers are typically processed in a lot and some of the defects that result appear on multiple wafers in the lot. Here a map that is the size of single wafer is created with all of the defects being transferred to the map from each of the wafers in the lot with the location of the defect on the map being the same as the original location on the individual wafers. In other words it is like stacking individual negatives and viewing through the entire stack with anything on any one of them being projected into the final image. Thus, where there are repeating defects in approximately the same location on more than one wafer, the corresponding point on the map will be darker and probably larger than an individual defect allowing the identification of those points as wafer stack defects using the clustering routine on that map as described in FIGS. 9a–9c either spatially or in feature space.

The clusters from this portion of the analysis operation are then also applied to blocks 282–294 for identification of their causality, the results stored by lock 280, and then block 210 removes those defect data points from the remaining defect data before moving on to the reticle field clustering operation at block 248. Reticle field clustering (block 248) is similar to wafer stack clustering with the difference being that multiple images of a reticle usually are projected onto a single wafer during the lithography process and here a map is created by taking the defects from each of the reticle sized regions on the substrate and mapping them to a single reticle sized map so that the map includes an image of all of the defects from all of those reticle sized regions placed as the corresponding defect is with respect to the metes and bounds of the reticle sized map. Here the user has the option of preforming the reticle field clustering on a single wafer at a time, or any number of wafers at the same time. It may also prove advantageous to make a first series of steps one wafer at a time, and once any defect data points are clustered as a result of those operations to perform the routine again using multiple wafers to be able to pick out the lower density defect clusters. In each pass, clustering is performed as discussed above either spatially or in feature space, with those clusters processed to identify the causations of the clusters, followed by the removal of the defects corresponding to the clusters identified in this phase of the operation from the remaining defects before proceeding to the next clustering operation, die stack clustering (block 258).

At block 258 die stack clustering begins with all of the defects in each single die projected to a die sized map in much the same way that wafer and reticle stacking has been described. Suppose you have a defect that is occurring on the same location on all of the die. By performing the die stack all of the defects map down to a single die sized map that includes all of the defects of all of the die with defects from the same relative locations of each die mapped to a corresponding location on the die stack map. This technique is useful for locating a reticle flaw that is repeated in equally spaced dice on the wafer. It turns out that there is enough error in the printing of the dice that the repeat defect locations will vary a little. If it is not a recurring problem you will wind up with a random problem.

As for each of the previous paths, the detected die stack clusters are examined to determine the cause of the various defects identified with the defects then removed from the remaining defect list before the next operation is performed, in this example, the last operation.

Figure 10C:
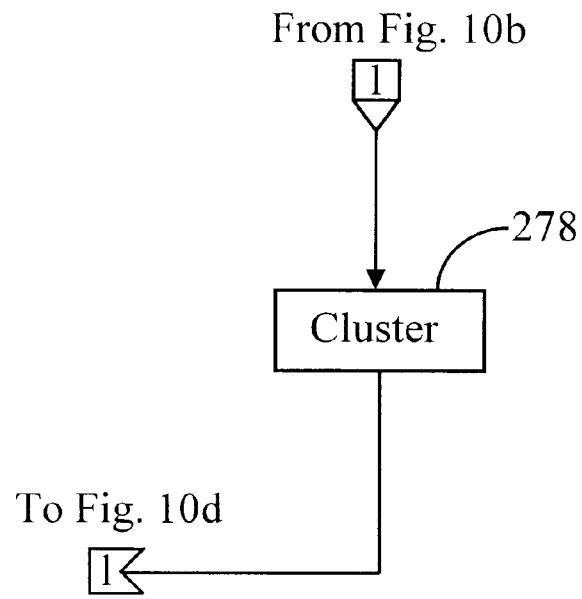
Figure 10E:
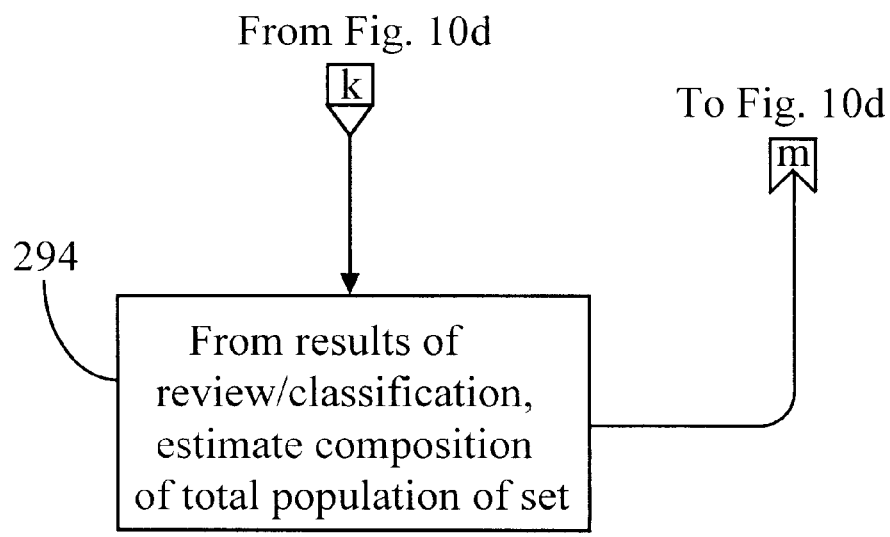
Figure 10D:
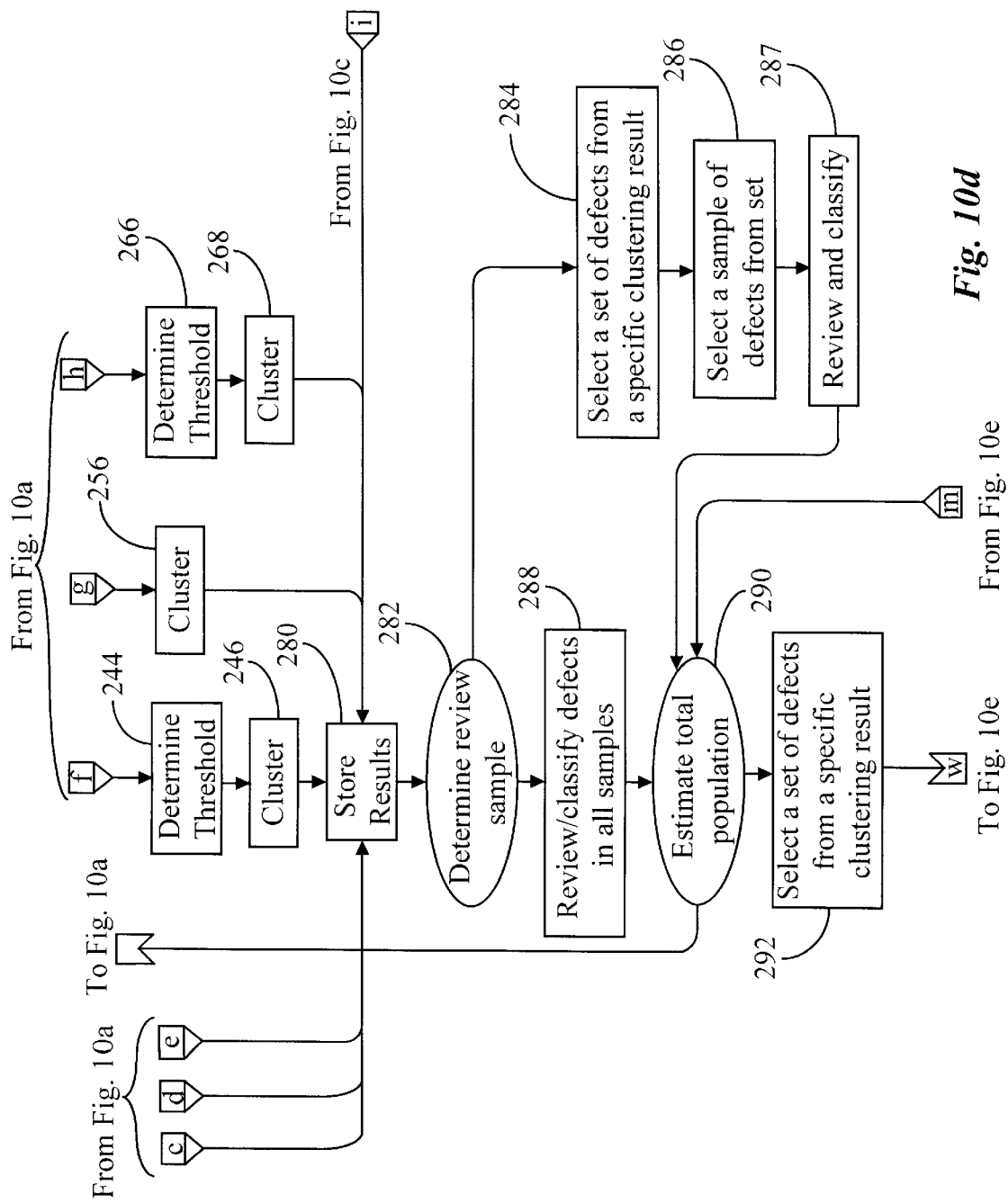

The last operation here has been called the multi-wafer die stack cluster (block 270, FIG. 10c). By this point in the clustering and defect causation identification a very high percentage of the initially detected defects have been removed from the list that is now presented to this final processing path. In other words, at this point in the processing the defectivity rate is very low. Thus to enable the detection of defects that belong to a cluster, the die stacking technique is not limited to the stacking of the die on single wafer, rather all of the die on all of the wafers that are being processed simultaneously are mapped to a single die sized map (block 270) from which the clustering (block 278) of FIGS. 9a–9c is performed spatially or in feature space, or both, with the causation of those clusters being determined (blocks 282–294).

Following the last process step, if the defects detected in that step are removed from the remaining list that was used during that phase of the operation, the defects that are left have a very high probability of being individual defects having their own cause or strictly random defects.

Thus it can be seen that the operation of the defect clustering operations of FIG. 10a–10e, and the defect causation determination is like the peeling of an onion which was mentioned above much earlier in the discussion of the present invention.

The discussion with respect to FIGS. 10a–10e, as stated above, is an example of an optimized defect data processing routine that incorporates the various techniques of the present invention and best solves the problems experienced in the manufacture of semiconductor devices using today's techniques and materials. In the future as new techniques and materials are developed the optimized routine will undoubtedly change and require a reordering of the techniques to best identify the defect causations. There may also be special cases with today's materials or a specific semiconductor product design, or manufacturing step that requires a specialized processing technique. There may also be some situations where one of the processing steps may need to be performed with a very low threshold and then after one or more other steps is performed, that earlier step may need to be revisited with a higher threshold. Further, as inspection machines become capable of measuring other characteristics of defects the procedures and the order of the steps in the overall procedure may need to be changed to optimize the determination of the causations of the various defects that are encountered and to minimize the processing time necessary to perform the necessary analysis.

In summary, then it should be clear that the overall processing routine that may be optimum for one type of semiconductor device may not be the optimum for others, and in the future there may still be other optimum routines. All of those are elements of the present invention, thus the present invention is extremely flexible and not limited to any particular processing steps or routine. Also, once the various causes of the defects are determined, corrective action could be taken either automatically if the process that needs to be revised is connected to network bus 106 or a report could be presented so that an operator could take manual action to bring about the changes necessary to minimize the recurrence of similar defects in later produced wafers.

While the present invention has been described in several modes of operation and with exemplary routines and apparatus, it is contemplated that persons skilled in the art, upon reading the preceding descriptions and studying the drawings, will realize various alternative approaches to the implementation of the present invention. It is therefore intended that the following appended claims be interpreted as including all such alterations and modifications that fall within the true spirit and scope to the present invention and the appended claims, with the scope of the present invention limited only by the scope of the appended claims.

What is claimed is:

1. A computer program stored on a computer-readable medium for analyzing data associated with defects on a substrate detected during production of semiconductor wafers, wherein for a region of interest on said substrate said data includes a quantitative number and density of defects and other characteristics of each of said defects, said computer program comprising:

instructions for calculating a minimum number of defects in said region to be included in a cluster of defects using said quantitative number of defects in said region of interest;

instructions for calculating a first maximum threshold of a first of said characteristics of said defects included in said defect data in said region to be included in a cluster of defects using said defect density in said region of interest; and instructions for generating a cluster of defects having at least said calculated minimum number of defects and each included defect having said first of said characteristics that does not exceed said first maximum threshold.

2. The computer program of claim 1 wherein a maximum number of defects in said cluster of defects is calculated as being log(number of defects in region of interest).

3. The computer program of claim 2 wherein said first maximum threshold of said first of said characteristics of said defects included in said defect data of defects in said region potentially includable in said cluster of defects is calculated as being the average of a Poisson distribution of said first characteristic for all of said defects in said region of interest.

4. The computer program of claim 2 wherein said first maximum threshold of said first of said characteristics of said defects included in said defect data of defects in said region potentially includable in said cluster of defects is calculated to have a highest value that maximizes the exclusion of defects in said cluster of defects wherein excludable defects taken together have a Poisson distribution.

5. The computer program of claim 4 wherein said first maximum threshold of said first characteristic of said defects in said region is calculated using the following equation:

$$r_N(p, n) = \frac{\sqrt{\log\left(\frac{1}{1-p^{\frac{1}{N}}}\right)}}{\sqrt{n}\sqrt{\pi}}$$

wherein r is said first maximum threshold, p is a user selected probability that all defects to be included in said cluster have the same causation, n is said defect density from said defect data for the defects in said region of interest, and N is said minimum number of defects to be included in said cluster.

6. The computer program of claim 1 wherein:

said characteristics of each of said defects includes location coordinates on said substrate and said cluster is to be determined spatially using said location coordinates; and said first maximum threshold is the maximum distance between any defect in said cluster and the next closest defect in said cluster.

7. The computer program of claim 6 for performing spatial clustering of selected ones of said defects:

wherein said defects and data associated with said defects in said region of interest earlier identified as being in a cluster have been removed from the data to be processed for spatial clustering with the remaining data organized in a forest of trees formatted defect map;

said instructions for generating a cluster of defects includes:

a. instructions for subdividing said region of interest into a grid of rows and columns of square bins, with each bin having a diagonal dimension equal to one half said maximum distance;

b. instructions for searching each bin in each row in said defect map, row by row, for bins that contain at least one defect;

c. instructions for row by row grouping together adjacent defect containing bins as individual groupings of defects with each such grouping of defects being a separate potential spatial cluster of defects;

d. instructions for searching for a first row having at least one defect containing bin and noting a column of said grid in which such bins are located;

e. instructions for searching in a second row that is a next adjacent row to said first row for defect containing bins that are in the same column, or a first, second or third column in either direction from said column in said first row in which a defect containing bin is located;

f. instructions for searching defect containing bins identified in e. for defect containing bins in the same column or next adjacent column to a corresponding defect containing bin in said first row;

g. instructions for combining defect containing bins identified in instructions f. with a grouping of defects associated with a corresponding defect containing bin in said first row;

h. instructions for searching in a third row that is a next adjacent row to said second row for defect containing bins that are in the same column, or a first, second or third column in either direction from said column in said first row in which a defect containing bin is located;

i. instructions for searching defect containing bins identified in instructions h. for defect containing bins in the same column or next adjacent column to a corresponding defect containing bin in said second row;

j. instructions for combining defect containing bins identified in instructions i. with a grouping of defects associated with a corresponding defect containing bin in said second row;

k. instructions for searching in a fourth row that is a next adjacent row to said third row for defect containing bins that are in a the same column, or a first, second or third column in either direction from said column in said first row in which a defect containing bin is located;

l. instructions for searching defect containing bins identified in instructions k. for defect containing bins in the same column or next adjacent column to a corresponding defect containing bin in said third row;

m. instructions for combining defect containing bins identified in instructions l. with a grouping of defects associated with a corresponding defect containing bin in said third row;

n. instructions for returning to instructions d. to continue to search additional subsequent rows and perform instructions e. through n. on each such row until all rows have been processed;

o. instructions for identifying each grouping of defects generated by instructions a. through n. that have said minimum number of defects to identify said groupings of defects as a spatial cluster; and p. instructions for preparing a list of said spatial clusters identified by instructions o.

8. The computer program of claim 7 further including the following instructions between instructions c. and d. as follows:

q. instructions for identifying in a first row each of said bins of said groupings of defects that are immediately adjacent an empty bin with said empty bin being immediately adjacent another defect containing bin having less than said minimum number of defects;

r. instructions for measuring in said first row a distance between each of said defects closest to the empty bin of instructions q. in said another defect containing bin and defects closest to the other side of the empty bin of instructions q. in said bin of said grouping of defects adjacent said empty bin of instructions q.;

s. instructions for including in said first row each of said defects in said another bin that are within said maximum distance of a defect in said grouping of defects into said grouping of defects as being a part of a same potential duster of defects;

t. instructions for identifying in said first row each of said bins of said groupings of defects that are immediately adjacent an empty bin with said empty bin being immediately adjacent another bin included within another grouping of defects;

u. instructions for measuring in said first row a distance between defects in each bin closest to and on opposite sides of the empty bin identified by instructions t.; and v. instructions for creating in said first row an enlarged grouping of defects by merging each of said groupings of defects containing said bins immediately adjacent said empty bin if the measured distance between any two defects on opposite sides of said empty bin are within said maximum distance with said enlarged grouping of defects being a part of the same potential cluster of defects.

9. The computer program of claim 1 wherein:

said characteristics of each of said defects includes defect features and said cluster is to be determined in feature space using at least one of said defect features; and said first maximum threshold is the maximum feature characteristic of said at least one of said defect features of any defect in said cluster.

10. The computer program of claim 1:

further includes:

instructions for calculating a second maximum threshold of a second of said characteristics of said defects included in said defect data of defects in said region to be included in a cluster of defects using said defect density in said region of interest; and said instructions for generating a cluster of defects having each included defect with said first and second of said characteristics with neither of said first and second of said characteristics exceeding said first and second maximum thresholds.

11. A computer program stored on a computer-readable medium for analyzing data associated with defects on a plurality of substrates simultaneously processed in a stack with each substrate spaced-apart from the next adjacent substrates during production of semiconductor wafers, wherein for a three dimensional region of interest defined relative to said stack that includes at least a portion of at least two substrates of said plurality of substrates, said data includes a quantitative number and density of defects, an identifier for each of said plurality of substrates relative to the stack position of the corresponding substrate, and other characteristics of each of said defects in said region, said computer program comprising:

instructions for calculating a minimum number of defects in said region to be included in a cluster of defects using said quantitative number of defects in said region of interest with said region including at least a portion of at least two substrates of said plurality of substrates;

instructions for calculating a first maximum threshold of a first of said characteristics of said defects included in said defect data of defects in said region to be included in a cluster of defects using said defect density in said region of interest with said region including at least a portion of at least two substrates of said plurality of substrates; and instructions for generating a cluster of defects having at least said calculated minimum number of defects and each included defect having said first of said characteristics that does not exceed said first maximum threshold with said region including at least a portion of at least two substrates of said plurality of substrates.

12. The computer program of claim 11 wherein:

said characteristics of each of said defects includes three dimensional location coordinates to determine position on a substrate and as to which of said plurality of substrates in said stack of substrates, and said cluster is to be determined spatially using said three dimensional location coordinates; and said first maximum threshold is the maximum distance between any defect in said cluster and the next closest defect in said cluster on the same substrate or on another of said plurality of substrates.

13. The computer program of claim 11 wherein:

said characteristics of each of said defects includes defect features and said cluster is to be determined in feature space using at least one of said defect features on the same substrate or on another of said plurality of substrates; and said first maximum threshold is the maximum feature characteristic of said at least one of said defect features of any defect in said cluster on the same substrate or on another of said plurality of substrates.

14. The computer program of claim 11:

further includes:

instructions for calculating a second maximum threshold of a second of said characteristics of said defects included in said defect data in said region to be included in a cluster of defects using said defect density in said region of interest with said region including at least a portion of at least two substrates of said plurality of substrates; and said instructions for generating a cluster of defects having each included defect with said first and second of said characteristics with neither of said first and second of said characteristics exceeding said first and second maximum thresholds with said region including at least a portion of at least two substrates of said plurality of substrates.

15. A computer program stored on a computer-readable medium for analyzing data associated with defects on a plurality of substrates simultaneously processed as a stack of said plurality of substrates each spaced-apart from the next adjacent ones of said plurality of substrates when in said stack during production of semiconductor wafers, said data includes a quantitative number and density of defects, an identifier for each of said plurality of substrates relative to the stack position of the corresponding substrate, location information of each defect on the corresponding substrate, and other characteristics of each of said defects in a region, said computer program comprising:

instructions for generating a defect map having a selected two dimensional sized and shaped region that corresponds to adjacent regions on each of said plurality of substrates when in said stack, with all of the defects from at least two of said plurality of substrates from the corresponding region on said substrates mapped onto said defect map with the same location in said selected two dimensional region as in said corresponding regions of said at least two substrates;

instructions for calculating a minimum number of defects in said defect map to be included in a cluster of defects using said quantitative number of defects in said defect map;

instructions for calculating a maximum threshold of one of said characteristics of said defects included in said defect data of defects in said defect map to be included in a cluster of defects using said defect density in said defect map; and instructions for generating a cluster of defects having at least said minimum number of defects and each included defect having said one characteristic that does not exceed said maximum threshold from said defect map.

16. A computer program stored on a computer-readable medium for analyzing data associated with defects in a plurality of reticle fields on a substrate produced using the same reticle for each of said plurality of reticle fields on said substrate during production of semiconductor wafers, said data includes a quantitative number and density of defects in each of said reticle fields on said substrate, location information of each defect within each of said plurality of reticle fields on said substrate, and other characteristics of each of said defects on said substrate, said computer program comprising:

instructions for generating a reticle field defect map having a two dimensional size and shape that corresponds to a size of a reticle of interest that was used a plurality of times in processing of said substrate, with all of the defects from each of selected ones of said plurality of reticle fields on said substrate mapped onto said reticle field defect map with the same location in said reticle field defect map as in said corresponding reticle field of said substrate;

instructions for calculating a minimum number of defects in said reticle field defect map to be included in a cluster of defects using said quantitative number of defects in said reticle field defect map;

instructions for calculating a maximum threshold of one of said characteristics of said defects included in said defect data of defects in said reticle field defect map to be included in a cluster of defects using said defect density in said reticle field defect map; and instructions for generating a cluster of defects having at least said calculated minimum number of defects and each included defect having said one of said characteristics that does not exceed said maximum threshold from said reticle field defect map.

17. A computer program stored on a computer-readable medium for analyzing data associated with defects in a plurality of reticle fields on each of a multiplicity of substrates produced using the same reticle for each of said plurality of reticle fields on each of said multiplicity of substrates during the production of semiconductor wafers, said data includes a quantitative number and density of defects in each of said reticle fields on each of said substrates, location information of each defect within each of said plurality of reticle fields on each of said substrates, identifying information as to which of said substrates each defect is located, and other characteristics of each of said defects on each of said substrates, said computer program comprising:

instructions for generating a reticle field defect map having a two dimensional size and shape that corresponds to a size of a reticle of interest that was used a plurality of times in the processing of said substrates, with all of the defects from each of selected ones of said plurality of reticle fields on each of said substrates mapped onto said reticle field defect map with the same location in said reticle field defect map as in said corresponding reticle field of said corresponding substrate;

instructions for calculating a minimum number of defects in said reticle field defect map to be included in a cluster of defects using said quantitative number of defects in said reticle field defect map;

instructions for calculating a maximum threshold of one of said characteristics of said defects included in said defect data in said reticle field defect map to be included in a cluster of defects using said defect density in said reticle field defect map; and instructions for generating a cluster of defects having at least said minimum number of defects and each included defect having said one of said characteristics that does not exceed said maximum threshold from said reticle field defect map.

18. A computer program stored on a computer-readable medium for analyzing data associated with defects in a plurality of die fields on a substrate, said data includes a quantitative number and density of defects in each of said die fields on said substrate during production of semiconductor wafers, location information of each defect within each of said plurality of die fields on said substrate, and other characteristics of each of said defects on said substrate, said computer program comprising:

instructions for generating a die field defect map having a two dimensional size and shape that corresponds to a size of a die of interest to be produced when processing of said substrate is complete, with all of the defects from each of selected ones of said plurality of die fields on said substrate mapped onto said die field defect map with the same location in said die field defect map as in said corresponding die field on said substrate;

instructions for calculating a minimum number of defects in said die field defect map to be included in a cluster of defects using said quantitative number of defects in said die field defect map;

instructions for calculating a maximum threshold of one of said characteristics of said defects included in said defect data in said die field defect map to be included in a cluster of defects using said defect density in said die field defect map; and instructions for generating a cluster of defects having at least said minimum number of defects and each included defect having said one of said characteristics that does not exceed said maximum threshold from said die field defect map.

19. A computer program stored on a computer-readable medium for analyzing data associated with defects in a plurality of die fields on each of a multiplicity of substrates simultaneously processed as a stack of said multiplicity of substrates each spaced-apart from the next adjacent ones of said multiplicity of substrates when in said stack, said data includes a quantitative number and density of defects in each of said plurality of die fields on each of said multiplicity of substrates during production of semiconductor wafers, location information of each defect within each of said plurality of die fields on each of said multiplicity of substrates, identifying information as to which of said multiplicity of substrates each defect is located, and other characteristics of each of said defects on each of said multiplicity of substrates, said computer program comprising:

instructions for generating a die field defect map having a two dimensional size and shape that corresponds to a size of a die of interest to be produced when processing of said substrates is complete, with all of the defects from each of said plurality of die fields on each of said multiplicity of substrates mapped onto said die field defect map with the same location in said die field defect map as in said corresponding die field of said corresponding substrate;

instructions for calculating a minimum number of defects in said die field defect map to be included in a cluster of defects using said quantitative number of defects in said die field defect map;

instructions for calculating a maximum threshold of one of said characteristics of said defects included in said defect data in said die field defect map to be included in a cluster of defects using said defect density in said die field defect map; and instructions for generating a cluster of defects having at least said minimum number of defects and each included defect having said one of said characteristics that does not exceed said maximum threshold from said die field defect map.

20. A computer program stored on a computer-readable medium for analyzing data associated with defects located on a region of a substrate during production of semiconductor wafers, said data includes a quantitative number and density of defects in said region of said substrate, location information of each defect in said region, and other characteristics of each of said defects in said region, said computer program comprising:

a. instructions for generating at least one cluster of defects from said data associated with defects located in said region by one of spatial clustering of defects, feature space clustering of defects, reticle field clustering of defects in several reticle fields in said region, and die field clustering of defects in several die fields in said region;

b. instructions for deleting individual defects included within each of said at least one cluster of defects generated in instructions a. from said data associated with defects located in said region to create a reduced data set and list of defects associated therewith; and c. instructions for repeating instructions a. if there is data remaining in said reduced data set from instructions b. until there is no longer any data remaining in said reduced data set from instructions b. or until no additional clusters of defects are generated in instructions a. by any of the clustering techniques on the last reduced data set from instructions b.;

wherein no defect is a member of more than one cluster, each cluster of defects is likely to have resulted from a single causation, and any defect data remaining in said reduced data set after the completion of instructions c. represents randomly occurring defects.

21. A computer program stored on a computer-readable medium for analyzing data associated with defects located on a plurality of substrates simultaneously processed as a stack of said plurality of substrates each spaced-apart from the next adjacent ones of said plurality of substrates when in said stack during production of semiconductor wafers, said data includes a quantitative number and density of defects on each of said plurality of substrates, location information of each defect on a corresponding one of said plurality of substrates, identifying information as to which of said plurality of substrates each defect is located on, and other characteristics of each of said defects on each of said plurality of substrates, said computer program comprising:

a. instructions for generating at least one cluster of defects from said data associated with defects located on a multiplicity of substrates each spaced-apart from the next adjacent ones of said multiplicity of substrates when in said stack by one of spatial clustering of defects on a single substrate, spatial clustering of defects on multiple substrates of said plurality of substrates, feature space clustering of defects on a single substrate, feature space clustering of defects on multiple substrates of said plurality of substrates, wafer stack clustering of defects on multiple substrates of said plurality of substrates, reticle field clustering of defects in several reticle fields on a single substrate, reticle field clustering of defects in several reticle fields on multiple substrates of said plurality of substrates, die field clustering of defects in several die fields on a single substrate, and die field clustering of defects in several die fields on multiple substrates of said plurality of substrates;

b. instructions for deleting individual defects included within each of said at least one cluster of defects generated in instructions a. from said data associated with defects located on a plurality of substrates to create a reduced data set and list of defects associated therewith;

c. instructions for repeating instructions a. if there is data remaining in said reduced data set from instructions b. until there is no longer any data remaining in said reduced data set from instructions b. or until no additional clusters of defects are generated in instructions a. by any of the clustering techniques on the last reduced data set from instructions b.;

wherein no defect is a member of more than one cluster, each cluster of defects is likely to have resulted from a single causation, and any terminal data remaining after the completion of instructions c. represents randomly occurring defects.

22. A method for analyzing data associated with defects on a substrate during production of semiconductor wafers, wherein for a region of interest on said substrate said data includes a quantitative number and density of defects and other characteristics of each of said defects, said method comprising the steps of:

calculating a minimum number of defects in said region to be included in a cluster of defects using said quantitative number of defects in said region of interest;

calculating a first maximum threshold of a first of said characteristics of said defects included in said defect data in said region to be included in a cluster of defects using said defect density in said region of interest; and generating a cluster of defects having at least said minimum number of defects and each included defect having said first of said characteristics that does not exceed said first maximum threshold.

23. The method of claim 22 wherein a maximum number of defects in said cluster of defects is calculated as being log(number of defects in region of interest).

24. The method of claim 23 wherein said first maximum threshold of said first of said characteristics of said defects included in said defect data of defects in said region potentially includable in said cluster of defects is calculated as being the average of a Poisson distribution of said first characteristic for all of said defects in said region of interest.

25. The method of claim 23 wherein said first maximum threshold of said first of said characteristics of said defects included in said defect data of defects in said region potentially includable in said cluster of defects is calculated to have a highest value that maximizes exclusion of defects in said cluster of defects wherein excludable defects taken together have a Poisson distribution.

26. The method of claim 25 wherein said first maximum threshold of said first characteristic of said defects in said region is calculated using the following equation:

$$r_N(p, n) = \frac{\sqrt{\log\left(\frac{1}{1 - p^{\frac{1}{N}}}\right)}}{\sqrt{n}\sqrt{\pi}}$$

wherein r is said first maximum threshold, p is a user selected probability that all defects to be included in said cluster have the same causation, n is said defect density from said defect data for the defects in said region of interest, and N is said minimum number of defects to be included in said cluster.

27. The method of claim 22 wherein:

said other characteristics of each of said defects includes location coordinates on said substrate and said cluster is to be determined spatially using said location coordinates; and said first maximum threshold is the maximum distance between any defect in said cluster and the next closest defect in said cluster.

28. The method of claim 27 for performing spatial clustering of selected ones of said defects:

wherein said defects and data associated with said defects in said region of interest earlier identified as being in a cluster have been removed from the data to be processed for spatial clustering with the remaining data organized in a forest of trees formatted defect map;

said generating a cluster of defects includes the steps of:

a. subdividing said region of interest into a grid of rows and columns of square bins, with each bin having a diagonal dimension equal to one half said maximum distance;

b. searching each bin in each row in said defect map, row by row, for bins that contain at least one defect;

c. row by row grouping together adjacent defect containing bins as individual groupings of defects with the defects in each such grouping of bins being a separate potential spatial cluster of defects;

d. searching for a first row having at least one defect containing bin and noting a column of said grid in which such bins are located;

e. searching in a second row that is a next adjacent row to said first row for defect containing bins that are in the same column, or a first, second or third column in either direction from said column in said first row in which a defect containing bin is located;

f. searching defect containing bins identified in step e. for defect containing bins in the same column or next adjacent column to a corresponding defect containing bin in said first row;

g. combining defect containing bins identified in step f. with a grouping of defects associated with a corresponding defect containing bin in said first row;

h. searching in a third row that is a next adjacent row to said second row for defect containing bins that are in a the same column, or a first, second or third column in either direction from said column in said first row in which a defect containing bin is located;

i. searching defect containing bins identified in step h. for defect containing bins in the same column or next adjacent column to a corresponding defect containing bin in said second row;

j. combining defect containing bins identified in step i. with a grouping of defects associated with a corresponding defect containing bin in said second row;

k. searching in a fourth row that is a next adjacent row to said third row for defect containing bins that are in a the same column, or a first, second or third column in either direction from said column in said first row in which a defect containing bin is located;

l. searching defect containing bins identified in step k. for defect containing bins in the same column or next adjacent column to a corresponding defect containing bin in said third row;

m. combining defect containing bins identified in step l. with a grouping of defects associated with a corresponding defect containing bin in said third row;

n. returning to step d. to continue to search additional subsequent rows and perform steps e. through n. on each such row until all rows have been processed;

o. identifying each grouping of defects generated by step a. through n. that have said minimum number of defects to identify said groupings of defects as a spatial cluster; and p. preparing a list of said spatial clusters identified in step o.

29. The method of claim 28 further including the following steps between steps c. and d. as follows:

q. identifying in a first row each of said bins of said groupings of defects that are immediately adjacent an empty bin with said empty bin being immediately adjacent another defect containing bin having less than said minimum number of defects;

r. measuring in said first row a distance between each of said defects in said another defect containing bin closest to the empty bin of step q. and defects closest to the other side of empty bin of step q. in said bin of said grouping of defects adjacent said empty bin of step q.;

s. including in said first row each of said defects in said another bin that are within said maximum distance of a defect in said grouping of defects into said grouping of defects as being a part of a same potential cluster of defects;

t. identifying in said first row each of said bins of said groupings of defects that are immediately adjacent an empty bin with said empty bin being immediately adjacent another bin included within another grouping of defects;

u. measuring in said first row a distance between defects in each bin closest to the empty bin and on opposite sides of the empty bin identified by step t.; and v. creating in said first row an enlarged grouping of defects by merging each of said groupings of defects containing said bins immediately adjacent said empty bin if the measured distance between any two defects on opposite sides of said empty bin are within said maximum distance with said enlarged grouping of defects being a part of the same potential cluster of defects.

30. The method of claim 22 wherein:

said characteristics of each of said defects includes defect features and said cluster is to be determined in feature space using at least one of said defect features; and said first maximum threshold is the maximum feature characteristic of said at least one of said defect features of any defect in said cluster.

31. The method of claim 22:

further includes the steps of:

calculating a second maximum threshold of a second of said characteristics of said defects included in said defect data of defects in said region to be included in a cluster of defects using said defect density in said region of interest; and said step of generating a cluster of defects having each included defect with said first and second of said characteristics with neither of said first and second of said characteristics exceeding said first and second maximum thresholds.

32. A method for analyzing data associated with defects on a plurality of substrates simultaneously processed in a stack with each substrate spaced-apart from the next adjacent substrates during processing, wherein for a three dimensional region of interest defined relative to said stack that includes at least a portion of at least two substrates of said plurality of substrates during production of semiconductor wafers, said data includes a quantitative number and density of defects, an identifier for each of said plurality of substrates relative to the stack position of the corresponding substrate, and other characteristics of each of said defects in said region, said method comprising the steps of:

calculating a minimum number of defects in said region to be included in a cluster of defects using said quantitative number of defects in said region of interest with said region including at least a portion of at least two substrates of said plurality of substrates;

calculating a first maximum threshold of a first of said characteristics of said defects included in said defect data of defects in said region to be included in a cluster of defects using said defect density in said region of interest with said region including at least a portion of at least two substrates of said plurality of substrates; and generating a cluster of defects having at least said minimum number of defects and each included defect having said first of said characteristics that does not exceed said first maximum threshold with said region including at least a portion of at least two substrates of said plurality of substrates.

33. The method of claim 32 wherein:

said other characteristics of each of said defects includes three dimensional location coordinates to determine position on a substrate and as to which of said plurality of substrates in said stack of substrates, and said cluster is to be determined spatially using said three dimensional location coordinates; and said first maximum threshold is the maximum distance between any defect in said cluster and the next closest defect in said cluster on the same substrate or on another of said plurality of substrates.

34. The method of claim 32 wherein:

said other characteristics of each of said defects includes defect features and said cluster is to be determined in feature space using at least one of said defect features on the same substrate or on another of said plurality of substrates; and said first maximum threshold is the maximum feature characteristic of said at least one of said defect features of any defect in said cluster on the same substrate or on another of said plurality of substrates.

35. The method of claim 32:

further includes the step of:

calculating a second maximum threshold of a second of said characteristics of said defects included in said defect data in said region to be included in a cluster of defects using said defect density in said region of interest with said region including at least a portion of at least two substrates of said plurality of substrates; and said step of generating a cluster of defects having each included defect with said first and second of said characteristics with neither of said first and second of said characteristics exceeding said first and second maximum thresholds with said region including at least a portion of at least two substrates of said plurality of substrates.

36. A method for analyzing data associated with defects on a plurality of substrates simultaneously processed as a stack of said plurality of substrates each spaced-apart from the next adjacent ones of said plurality of substrates when in said stack during production of semiconductor wafers, said data includes a quantitative number and density of defects, an identifier for each of said plurality of substrates relative to the stack position of the corresponding substrate, location information of each defect on the corresponding substrate, and other characteristics of each of said defects in a region, said method comprising the steps of:

generating a defect map having a selected two dimensional sized and shaped region that corresponds to adjacent regions on each of said plurality of substrates when in said stack, with all of the defects from at least two of said plurality of substrates from the corresponding region on said substrates mapped onto said defect map with the same location in said selected two dimensional region as in said corresponding regions of said at least two substrates;

calculating a minimum number of defects in said defect map to be included in a cluster of defects using said quantitative number of defects in said defect map;

calculating a maximum threshold of one of said characteristics of said defects included in said defect data of defects in said defect map to be included in a cluster of defects using said defect density in said defect map; and generating a cluster of defects having at least said minimum number of defects and each included defect having said one characteristic that does not exceed said maximum threshold from said defect map.

37. A method for analyzing data associated with defects in a plurality of reticle fields on a substrate produced using the same reticle for each of said plurality of reticle fields on said substrate during production of semiconductor wafers, said data includes a quantitative number and density of defects in each of said reticle fields on said substrate, location information of each defect within each of said plurality of reticle fields on said substrate, and other characteristics of each of said defects on said substrate, said method comprising the steps of:

generating a reticle field defect map having a two dimensional size and shape that corresponds to a size of a reticle of interest that was used a plurality of times in processing of said substrate, with all of the defects from each of selected ones of said plurality of reticle fields on said substrate mapped onto said reticle field defect map with the same location in said reticle field defect map as in said corresponding reticle field of said substrate;

calculating a minimum number of defects in said reticle field defect map to be included in a cluster of defects using said quantitative number of defects in said reticle field defect map;

calculating a maximum threshold of one of said characteristics of said defects included in said defect data of defects in said reticle field defect map to be included in a cluster of defects using said defect density in said reticle field defect map; and generating a cluster of defects having at least said minimum number of defects and each included defect having said one of said characteristics that does not exceed said maximum threshold from said reticle field defect map.

38. A method for analyzing data associated with defects in a plurality of reticle fields on each of a multiplicity of substrates produced using the same reticle for each of said plurality of reticle fields on each of said multiplicity of substrates during production of semiconductor wafers, said data includes a quantitative number and density of defects in each of said reticle fields on each of said substrates, location information of each defect within each of said plurality of reticle fields on each of said substrates, identifying information as to which of said substrates each defect is located, and other characteristics of each of said defects on each of said substrates, said method comprising the steps of:

generating a reticle field defect map having a two dimensional size and shape that corresponds to a size of a reticle of interest that was used a plurality of times in the processing of said substrates, with all of the defects from each of selected ones of said plurality of reticle fields on each of said substrates mapped onto said reticle field defect map with the same location in said reticle field defect map as in said corresponding reticle field of said corresponding substrate;

calculating a minimum number of defects in said reticle field defect map to be included in a cluster of defects using said quantitative number of defects in said reticle field defect map;

calculating a maximum threshold of one of said characteristics of said defects included in said defect data in said reticle field defect map to be included in a cluster of defects using said defect density in said reticle field defect map; and generating a cluster of defects having at least said minimum number of defects and each included defect having said one of said characteristics that does not exceed said maximum threshold from said reticle field defect map.

39. A method for analyzing data associated with defects in a plurality of die fields on a substrate during production of semiconductor wafers, said data includes a quantitative number and density of defects in each of said die fields on said substrate, location information of each defect within each of said plurality of die fields on said substrate, and other characteristics of each of said defects on said substrate, said method comprising the steps of:

generating a die field defect map having a two dimensional size and shape that corresponds to a size of a die of interest to be produced when processing of said substrate is complete, with all of the defects from each of selected ones of said plurality of die fields on said substrate mapped onto said die field defect map with the same location in said die field defect map as in said corresponding die field on said substrate;

calculating a minimum number of defects in said die field defect map to be included in a cluster of defects using said quantitative number of defects in said die field defect map;

calculating a maximum threshold of one of said characteristics of said defects included in said defect data in said die field defect map to be included in a cluster of defects using said defect density in said die field defect map; and generating a cluster of defects having at least said minimum number of defects and each included defect having said one of said characteristics that does not exceed said maximum threshold from said die field defect map.

40. A method for analyzing data associated with defects in a plurality of die fields on each of a multiplicity of substrates simultaneously processed as a stack of said multiplicity of substrates each spaced-apart from the next adjacent ones of said multiplicity of substrates when in said stack during production of semiconductor wafers, said data includes a quantitative number and density of defects in each of said plurality of die fields on each of said multiplicity of substrates, location information of each defect within each of said plurality of die fields on each of said multiplicity of substrates, identifying information as to which of said multiplicity of substrates each defect is located, and other characteristics of each of said defects on each of said multiplicity of substrates, said method comprising the steps of:

generating a die field defect map having a two dimensional size and shape that corresponds to a size of a die of interest to be produced when processing of said substrates is complete, with all of the defects from each of said plurality of die fields on each of said multiplicity substrates mapped onto said die field defect map with the same location in said die field defect map as in said corresponding die field of said corresponding substrate;

calculating a minimum number of defects in said die field defect map to be included in a cluster of defects using said quantitative number of defects in said die field defect map;

calculating a maximum threshold of one of said characteristics of said defects included in said defect data in said die field defect map to be included in a cluster of defects using said defect density in said die field defect map; and generating a cluster of defects having at least said minimum number of defects and each included defect having said one of said characteristics that does not exceed said maximum threshold from said die field defect map.

41. A method for analyzing data associated with defects located on a region of a substrate during production of semiconductor wafers, said data includes a quantitative number and density of defects in said region of said substrate, location information of each defect in said region, and other characteristics of each of said defects in said region, said method comprising the steps of:

a. generating at least one cluster of defects from said data associated with defects located in said region by one of spatial clustering of defects, feature space clustering of defects, reticle field clustering of defects in several reticle fields in said region, and die field clustering of defects in several die fields in said region;

b. deleting individual defects included within each of said at least one cluster of defects generated in step a. from said data associated with defects located in said region to create a reduced data set and list of defects associated therewith; and c. repeating step a. if there is data remaining in said reduced data set from step b. until there is no longer any data remaining in said reduced data set from step b. or until no additional clusters of defects are generated in step a. by any of the clustering techniques on the last reduced data set from step b.;

wherein no defect is a member of more than one cluster, each cluster of defects is likely to have resulted from a single causation, and any defect data remaining in said reduced data set after the completion of step c. represents randomly occurring defects.

42. A method for analyzing data associated with defects located on a plurality of substrates simultaneously processed as a stack of said plurality of substrates each spaced-apart from the next adjacent ones of said plurality of substrates when in said stack during production of semiconductor wafers, said data includes a quantitative number and density of defects on each of said plurality of substrates, location information of each defect on a corresponding one of said plurality of substrates, identifying information as to which of said plurality of substrates each defect is located on, and other characteristics of each of said defects on each of said plurality of substrates, said method comprising the steps of:

a. generating at least one cluster of defects from said data associated with defects located on a multiplicity of substrates each spaced-apart from the next adjacent ones of said multiplicity of substrates when in said stack by one of spatial clustering of defects on a single substrate, spatial clustering of defects on multiple substrates of said plurality of substrates, feature space clustering of defects on a single substrate, feature space clustering of defects on multiple substrates of said plurality of substrates, wafer stack clustering of defects on multiple substrates of said plurality of substrates, reticle field clustering of defects in several reticle fields on a single substrate, reticle field clustering of defects in several reticle fields on multiple substrates of said plurality of substrates, die field clustering of defects in several die fields on a single substrate, and die field clustering of defects in several die fields on multiple substrates of said plurality of substrates;

b. deleting individual defects included within each of said at least one cluster of defects generated in step a. from said data associated with defects located on a plurality of substrates to create a reduced data set and list of defects associated therewith;

c. repeating step a. if there is data remaining in said reduced data set from step b. until there is no longer any data remaining in said reduced data set from step b. or until no additional clusters of defects are generated in step a. by any of the clustering techniques on the last reduced data set from step b.;

wherein no defect is a member of more than one cluster, each cluster of defects is likely to have resulted from a single causation, and any terminal data remaining after the completion of step c. represents randomly occurring defects.

* * * * *